(12) United States Patent
Kim et al.

(10) Patent No.: US 9,484,419 B2
(45) Date of Patent: Nov. 1, 2016

(54) OXIDE THIN FILM, METHOD FOR POST-TREATING OXIDE THIN FILM AND ELECTRONIC APPARATUS

(71) Applicant: Industry-Academic Cooperation Foundation, Yonsei University, Seoul (KR)

(72) Inventors: Hyun Jae Kim, Seoul (KR); Young Jun Tak, Seoul (KR); Doo Hyun Yoon, Seoul (KR); Sung Pyo Park, Seoul (KR); Heesoo Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/738,477

(22) Filed: Jun. 12, 2015

(65) Prior Publication Data
US 2015/0364554 A1 Dec. 17, 2015

(30) Foreign Application Priority Data
Jun. 12, 2014 (KR) .......................... 10-2014-0071592

(51) Int. Cl.
| | | |
|---|---|---|
| *H01L 29/24* | (2006.01) | |
| *H01L 29/36* | (2006.01) | |
| *H01L 21/322* | (2006.01) | |
| *H01L 21/477* | (2006.01) | |
| *H01L 21/02* | (2006.01) | |

(52) U.S. Cl.
CPC ......... *H01L 29/24* (2013.01); *H01L 21/02554* (2013.01); *H01L 21/02565* (2013.01); *H01L 21/02614* (2013.01); *H01L 21/477* (2013.01)

(58) Field of Classification Search
CPC ..... H01L 29/24; H01L 29/36; H01L 21/322; H01L 21/477; H01L 21/02554; H01L 21/02565; H01L 21/02614
See application file for complete search history.

(56) References Cited

U.S. PATENT DOCUMENTS

| | | | |
|---|---|---|---|
| 2002/0037609 A1 | 3/2002 | Zhang et al. | |
| 2005/0164445 A1* | 7/2005 | Lin ....................... | H01L 29/513 438/240 |
| 2005/0221568 A1 | 10/2005 | Ishida et al. | |
| 2011/0133179 A1* | 6/2011 | Yamazaki ........... | H01L 21/3003 257/43 |
| 2011/0193050 A1* | 8/2011 | Takano ................ | H01L 27/2409 257/4 |
| 2015/0037980 A1* | 2/2015 | Rha ....................... | H01L 21/306 438/700 |
| 2015/0155169 A1* | 6/2015 | Oota ....................... | H01L 28/20 438/104 |

FOREIGN PATENT DOCUMENTS

| | | |
|---|---|---|
| CN | 1677613 | 10/2005 |
| CN | 100521072 | 7/2009 |

(Continued)

OTHER PUBLICATIONS

Notice of Allowance for KR App No. 10-2014-0071592 dated Oct. 5, 2015, 7 pgs.
Kim, D.S., A Study on the Properties of the Magnetic Semiconductor GaMnAs Depending on Thin Film Deposition and the Treatment Conditions, The Institute of Electronics and Information Engineers, Sep. 2008, 4 pgs, [Online] URL: http://www.dbpia.co.kr/Journal/ArticleDetail/893689.

*Primary Examiner* — Fazli Erdem
(74) *Attorney, Agent, or Firm* — Procopio, Cory, Hargreaves & Savitch LLP

(57) ABSTRACT

Provided are an oxide thin film, a method for post-treating an oxide thin film and an electronic apparatus. An oxide thin film is an oxide thin film with a single layer including a metal oxide, and the physical properties of the oxide thin film may change in the thickness direction thereof.

3 Claims, 27 Drawing Sheets

(56) References Cited

FOREIGN PATENT DOCUMENTS

| | | |
|---|---|---|
| JP | 2005294638 | 10/2005 |
| JP | 4232675 | 3/2009 |
| JP | 2011-009619 | 1/2011 |
| KR | 10-2001-0006883 | 1/2001 |
| KR | 20060045369 | 5/2006 |
| KR | 100666888 | 1/2007 |
| KR | 10-0787464 | 12/2007 |
| KR | 10-2012-0100241 | 9/2012 |
| KR | 10-2011-0051718 | 12/2012 |
| KR | 10-2013-0127150 | 11/2013 |

* cited by examiner

OXIDE THIN FILM, METHOD FOR POST-TREATING OXIDE THIN FILM AND ELECTRONIC APPARATUS

CROSS-REFERENCE TO RELATED APPLICATIONS

This U.S. non-provisional patent application claims priority under 35 U.S.C. §119 of Korean Patent Application No. 10-2014-0071592, filed on Jun. 12, 2014, the entire contents of which are hereby incorporated by reference.

BACKGROUND

The present disclosure herein relates to an oxide thin film, a method for post-treating an oxide thin film and an electronic apparatus.

Recently, in order to increase the electrical properties and reliability of an oxide thin film transistor, a method of forming a thin film with a multilayer structure is being suggested. If the thin film is formed into a multilayer, a device with improved performance may be manufactured when compared to a device with a thin film having a single layer; however processes for forming the thin film may be repeatedly performed to largely increase time and costs required for the manufacture of the device.

In addition, the method of forming a thin film with a multilayer structure may be performed not by a vacuum evaporation method but only by a solution process.

SUMMARY

The present disclosure provides an oxide thin film with a single layer having improved electrical properties and reliability as a thin film with a multilayer structure and an electronic apparatus using the same.

The present disclosure also provides a method for post-treating an oxide thin film with a single layer having improved electrical properties and reliability as a thin film with a multilayer structure.

The present disclosure also provides a method for post-treating an oxide thin film with improved thin film properties irrespective of a method used for forming a thin film such as a vacuum evaporation method, a solution process, etc.

The present disclosure also provides a method for post-treating an oxide thin film realizing improved performance while decreasing manufacturing time and costs when compared to the forming method of a thin film into a multilayer structure.

An embodiment of the inventive concept provides an oxide thin film with a single layer including a metal oxide, wherein physical properties of the oxide thin film change in the thickness direction thereof.

In an embodiment, the amount of oxygen vacancies may change in the thickness direction of the oxide thin film.

In an embodiment, the amount of bonds between a metal and oxygen may change in the thickness direction of the oxide thin film.

In an embodiment, the amount of hydroxyl groups may change in the thickness direction of the oxide thin film.

In an embodiment, the physical properties may increase or decrease from a first region of the oxide thin film to a second region facing the first region in the thickness direction of the oxide thin film.

In an embodiment, the physical properties may increase or decrease gradually from the first region to the second region of the oxide thin film.

In an embodiment, the first region may be adjacent to a first side of the oxide thin film, and the second region may be adjacent to a second side facing the first side of the oxide thin film.

In an embodiment of the inventive concept, a method for post-treating an oxide thin film includes heat treating an oxide thin film in a first gas atmosphere and heat treating the oxide thin film in a second gas atmosphere, wherein a material forming a second gas has higher diffusion activation energy than a material forming a first gas.

In an embodiment, the material forming the second gas may have larger atomic radius than the material forming the first gas.

In an embodiment, the material forming the second gas may have larger atomic weight than the material forming the first gas.

In an embodiment, the material forming the first gas may include at least one of hydrogen, helium or fluorine.

In an embodiment, the heat treating of the oxide thin film in the first gas atmosphere may include heat treating the oxide thin film in the first gas atmosphere at a temperature within a range from about 100 to about 200° C.

In an embodiment, the heat treating of the oxide thin film in the first gas atmosphere may include heat treating the oxide thin film in the first gas atmosphere with a pressure within a range from about 5 to about 40 atm.

In an embodiment, the material forming the second gas may be at least one of oxygen, water vapor, hydrogen peroxide or carbon dioxide.

In an embodiment, the method for post-treating an oxide thin film may further include heat treating in a third gas atmosphere, and a material forming a third gas may have higher diffusion activation energy than the material forming the second gas.

In an embodiment, the material forming the third gas may include ozone.

In an embodiment of the inventive concept, an electronic apparatus includes a substrate and an oxide thin film on the substrate, wherein the oxide thin film is an oxide thin film with a single layer including a metal oxide, and physical properties of the oxide thin film change in the thickness direction thereof.

In an embodiment, the electronic apparatus may include a transistor, and the oxide thin film may be provided as a channel layer of the transistor.

In an embodiment, the electronic apparatus may include a resistive memory, and the oxide thin film may be provided as an insulation layer included in the resistive memory.

In an embodiment, the electronic apparatus may include an electronic device, and the oxide thin film may be provided as an electrode of a terminal of the electronic device.

According to an embodiment of the inventive concept, the electrical properties and reliability of a thin film with a single layer may be improved by changing the physical properties in the thickness direction of the thin film as a thin film with a multilayer structure.

According to an embodiment of the inventive concept, a thin film with a single layer may provide improved electrical properties and reliability by post-treating the thin film as a thin film of a multilayer structure.

According to an embodiment of the inventive concept, the performance of the thin film may be improved irrespective of a method used for forming the thin film such as a vacuum evaporation method and a solution process.

According to an embodiment of the inventive concept, the performance increase of the thin film may be realized while decreasing manufacturing time and costs when compared to a thin film with a multilayer structure.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
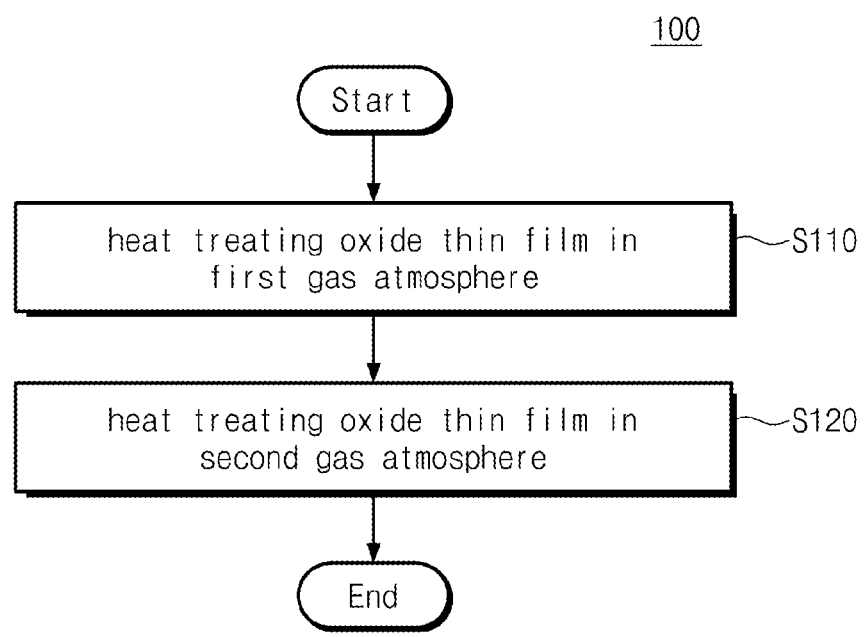
FIG. 1 is an exemplary flowchart of a post-treating method of an oxide thin film according to an embodiment.

Other objects and features of the inventive concept and a method of accomplishing thereof will be clearly understood from exemplary embodiments with reference to the accompanying drawings. The inventive concept may, however, be embodied in different forms and should not be construed as limited to the embodiments set forth herein. Rather, these embodiments are provided so that this disclosure will be thorough and complete and will fully convey the scope of the inventive concept to those skilled in the art, and the inventive concept should be defined only by the scope of the claims.

Even though not defined, all terms used herein (including technical or scientific terms), have the same meaning as that commonly admitted by common techniques in related art of the inventive concept. Terms defined by a common dictionary may be interpreted to have the same meaning as that of relevant technique and/or the body of this disclosure and may not be conceptualized or interpreted excessively formally even though not clearly defined herein.

The terminology used herein is for the purpose of describing particular example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated features, components, constituent elements, steps, operations, and/or devices, but do not preclude the presence or addition of one or more other features, components, constituent elements, steps, operations, and/or devices thereof. It will also be understood that the term "and/or" in this disclosure will include each elements listed and various combinations thereof.

An embodiment of the inventive concept relates to a method for post-treating an oxide thin film for improving the properties of a thin film by heat treating the oxide thin film in a first gas atmosphere and heat treating in a second gas atmosphere formed using a material having higher diffusion activation energy than a material forming the first gas, and a method of manufacturing a semiconductor device using the same. In addition, an embodiment of the inventive concept relates to an oxide thin film with a single layer in which physical properties may change in a thickness direction and an electronic apparatus using the same.

According to an embodiment of the inventive concept, oxygen vacancies in the thin film may increase, and conductivity of the thin film may increase by heat treating the thin film in the first gas atmosphere formed using a material relatively easily diffusing. After that, the thin film is heat treated in the second gas atmosphere formed using a material relatively hardly diffusing, and the conductivity of a portion of the thin film, for example, the top side of the thin film may decrease.

As a result, the conductivity in the thickness direction may change even in the thin film even with a single layer, and substantially the same properties as the thin film with a multilayer structure may be obtained.

Hereinafter, embodiments of the inventive concept will be described in detail referring to attached drawings herein.

FIG. 1 is an exemplary flowchart of a method for post-treating an oxide thin film according to an embodiment of the inventive concept.

As shown in FIG. 1, the method for post-treating the oxide thin film 100 may include a step of heat treating an oxide thin film in a first gas atmosphere (S110) and a step of heat treating the oxide thin film in a second gas atmosphere (S120).

As described above, according to an embodiment of the inventive concept, the material forming the second gas may have higher diffusion activation energy than the material forming the first gas. That is, the diffusion of the material forming the second gas in the thin film may be harder than the material forming the first gas.

According to another embodiment, the material forming the second gas may have a larger radius than the material forming the first gas.

For example, in the case that the first gas and the second gas are simple substances, the radius of the material forming the second gas may be larger than the material forming the first gas.

According to another embodiment, the material forming the second gas may have a larger atomic weight than the material forming the first gas.

For example, in the case that the first gas and the second gas are simple substances, the atomic weight of the material forming the second gas may be larger than the material forming the first gas. However, in the case that the first gas and the second gas are compounds, the molecular weight of the material forming the second gas may be larger than the material forming the first gas.

According to an embodiment of the inventive concept, the material forming the first gas may include at least one of hydrogen, helium or fluorine, without limitation. Particularly, hydrogen is an element having the smallest radius and the smallest atomic weight in the periodic table and has low diffusion activation energy when compared to other elements. Thus, the hydrogen may easily diffuse in the thin film.

According to an embodiment, the step of heat treating the oxide thin film in the first gas atmosphere (S110) may include a step of heat treating the oxide thin film in the first gas atmosphere at the temperature within a range from about 100 to about 200° C. That is, the temperature of heat treatment performed in the first gas atmosphere may be from about 100 to about 200° C.

According to an embodiment, the step of heat treating the oxide thin film in the first gas atmosphere (S110) may include a step of heat treating the oxide thin film in the first gas atmosphere at the pressure within a range from about 5 to about 40 atm. That is, the inner pressure of a chamber with the first gas atmosphere may be in a range from about 5 to about 40 atm.

According to an embodiment, the step of heat treating the oxide thin film in the first gas atmosphere (S110) may include a step of heat treating the oxide thin film in the first gas atmosphere for a time period within a range from about 30 minutes to about 2 hours. That is, the time period of the heat treatment in the first gas atmosphere may be from about 30 minutes to about 2 hours.

According to an embodiment of the inventive concept, the material forming the second gas may include at least one of oxygen, water vapor, hydrogen peroxide or carbon dioxide, without limitation. Here, the atomic radius and the atomic weight of the oxygen are greater than the hydrogen which is used as the first gas, and the oxygen has higher diffusion activation energy than the hydrogen. Thus, the diffusion of the oxygen is relatively hard when compared to that of the hydrogen.

According to an embodiment, the step of heat treating the oxide thin film in the second gas atmosphere (S120) may include a step of heat treating the oxide thin film in the second gas atmosphere in the temperature within a range from about 100 to about 200° C. That is, the temperature for heat treating in the second gas atmosphere may be within a range from about 100 to about 200° C.

According to an embodiment, the step of heat treating the oxide thin film in the second gas atmosphere (S120) may include a step of heat treating the oxide thin film in the second gas atmosphere at the pressure within a range from about 5 to about 20 atm. That is, the inner pressure of a chamber with the second gas atmosphere may be within a range from about 5 to about 20 atm.

According to an embodiment, the step of heat treating the oxide thin film in the second gas atmosphere (S120) may include a step of heat treating the oxide thin film in the second gas atmosphere for a time period within a range from about 30 minutes to about 2 hours. That is, the time period of the heat treatment in the second gas atmosphere may be from about 30 minutes to about 2 hours.

According to an embodiment, the temperature for heat treating performed in the second gas atmosphere may be the same as that for heat treating performed in the first gas atmosphere. In addition, the time period for heat treating performed in the second gas atmosphere may be the same as that for heat treating performed in the first gas atmosphere.

In this case, as described above, the diffusion of the material forming the second gas in the thin film may be slower than the material forming the first gas, and the material forming the second gas may diffuse partially in the thin film not throughout thereof.

Figure 2:
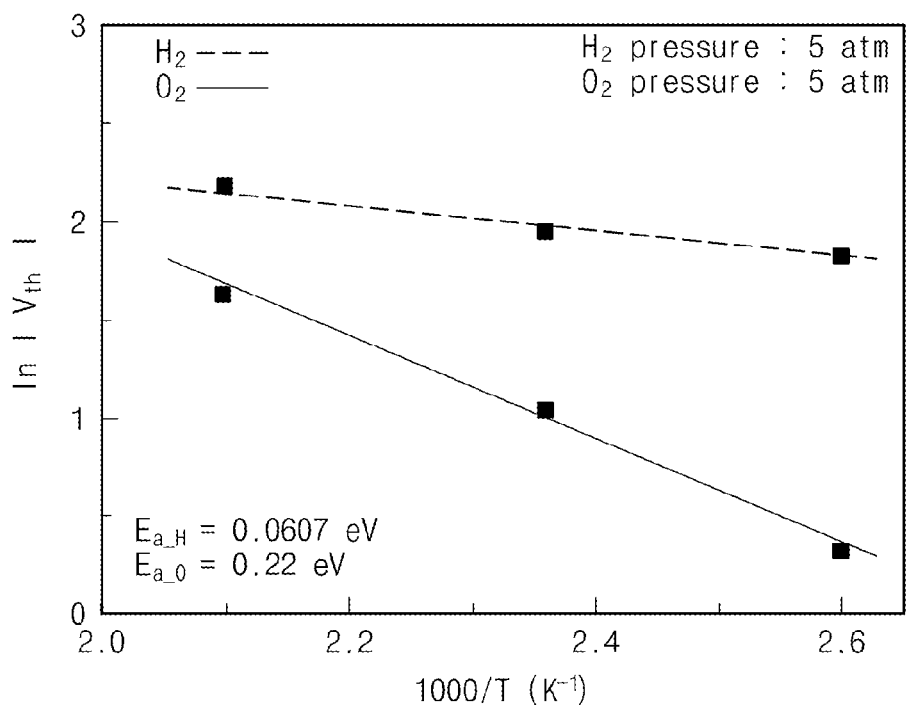
FIG. 2 is an Arrhenius plot for obtaining the diffusion activation energy of hydrogen and oxygen.

FIG. 2 is an Arrhenius plot for obtaining the diffusion activation energy of hydrogen and oxygen.

The diffusion activation energy $E_a$ of a material may be calculated by representing the log value of a parameter affected by the diffusion in the thin film of the material with respect to the inverse of the absolute temperate $K^{-1}$ by Arrhenius plot. In this case, the Arrhenius plot is represented as a straight line with negative slope, and the diffusion activation energy $E_a$ of the material corresponds to the absolute value of the slope of the straight line.

The Arrhenius plot of hydrogen and oxygen shown in FIG. 2 was obtained by heat treating the oxide thin film in a hydrogen and oxygen atmosphere of about 5 atm at the temperature of about 100, about 150 and about 200° C. for about 1 hour and calculating the natural log value of the absolute value of the threshold voltage $V_{th}$ of an oxide thin film transistor having an oxide thin film as a channel layer.

As a result, as shown in FIG. 2, the Arrhenius plot of oxygen changes more rapidly than the Arrhenius plot of hydrogen, and the diffusion activation energy of hydrogen and oxygen is calculated as about 0.0607 eV and about 0.22 eV, respectively. Thus, it may be found that the diffusion activation energy of the hydrogen is greater than that of the oxygen.

Figure 3:
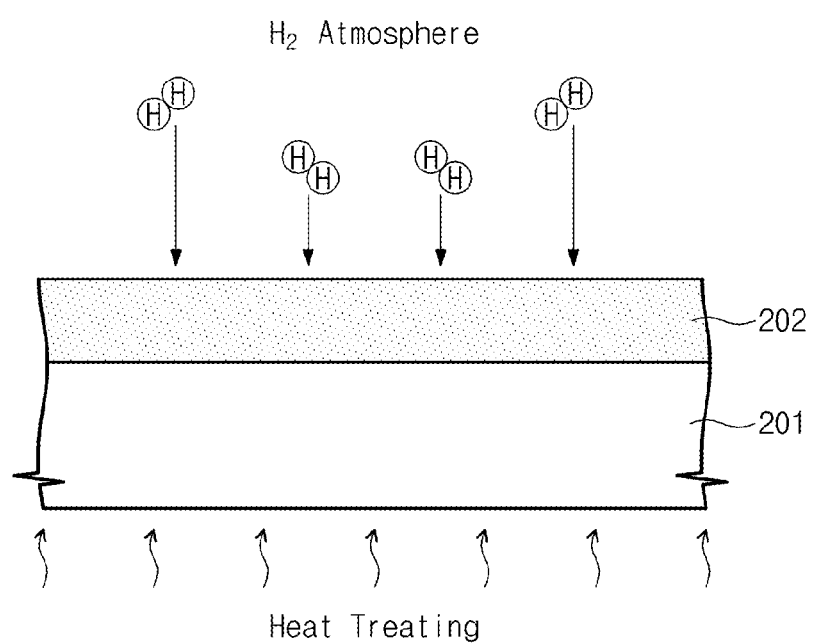
FIGS. 3 and 4 are exemplary diagrams for explaining a post-treating process of a thin film in a hydrogen atmosphere and an oxygen atmosphere and explaining the consequent change of the properties of the thin film according embodiments.
Figure 4:
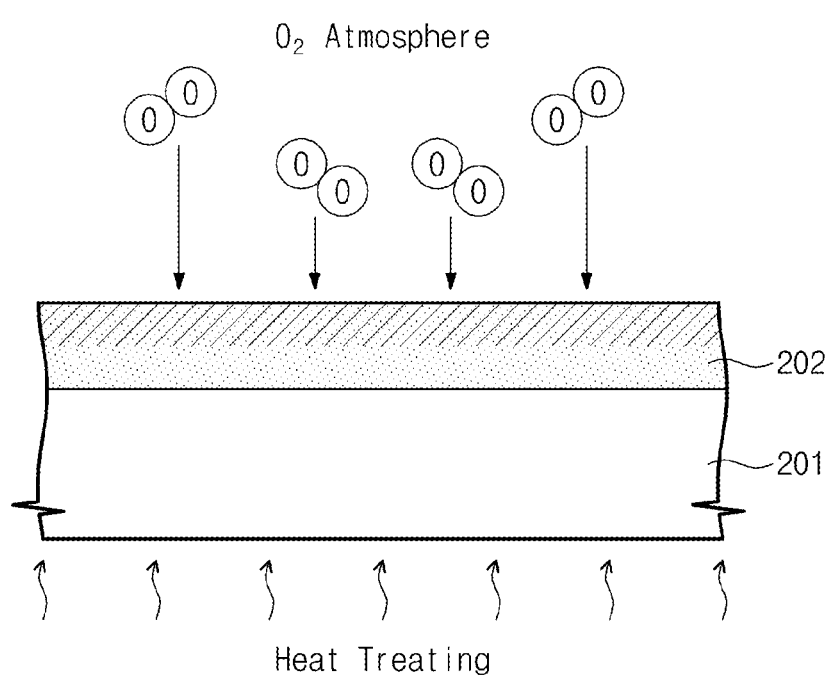

FIGS. 3 and 4 are exemplary diagrams for explaining a post-treating process of a thin film in a hydrogen atmosphere and an oxygen atmosphere and explaining the consequent change of the properties of the thin film according to embodiments.

As shown in FIG. 3, in the case that an oxide thin film 202 formed on a substrate 201 is heat treated in a hydrogen atmosphere with relatively low diffusion activation energy, hydrogen may easily diffuse in the thin film 202, and the defects of oxygen vacancies in the thin film 202 may increase. Thus, the threshold voltage $V_{th}$ of a device may move to a negative direction, and the conductivity of the thin film 202 may increase overall.

Then, as shown in FIG. 4, in the case that the oxide thin film 202 is heat treated in an oxygen atmosphere with relatively high diffusion activation energy, oxygen may diffuse in the thin film 202 more difficulty than hydrogen, and the oxygen may not diffuse throughout the thin film but may diffuse partially, that is to the upper portion of the thin film shown by diagonal lines in FIG. 4, thereby oxidizing the back portion of the device.

By the above-described action, according to an embodiment of the inventive concept, the off-state current of the device may decrease through the heat treatment in the oxygen atmosphere while increasing the on-state current of the device through the heat treatment in the hydrogen atmosphere. Thus, the electrical properties of the device such as electron mobility and the current ratio of on/off may be improved.

The above-described embodiments were explained referring to the heat treatment of the oxide thin film in the first and second atmosphere. However, the post-treatment of the thin film according to embodiments may include heat treatment in another gas atmosphere further.

For example, according to another embodiment of the inventive concept, the method for post-treating the oxide thin film 100 may further include a step of heat treating the oxide thin film in a third gas atmosphere. In this case, a material forming the third gas may have higher diffusion activation energy than the material forming the second gas.

According to an embodiment, the material forming the third gas may include ozone, without limitation. In addition, after the heat treatment in the third gas atmosphere, heat treatment in a fourth gas atmosphere, heat treatment in a fifth gas atmosphere, etc. may be further performed according to an embodiment. Thus, the number of the heat treatment according to an embodiment of the inventive concept may be two or more.

Figure 5:
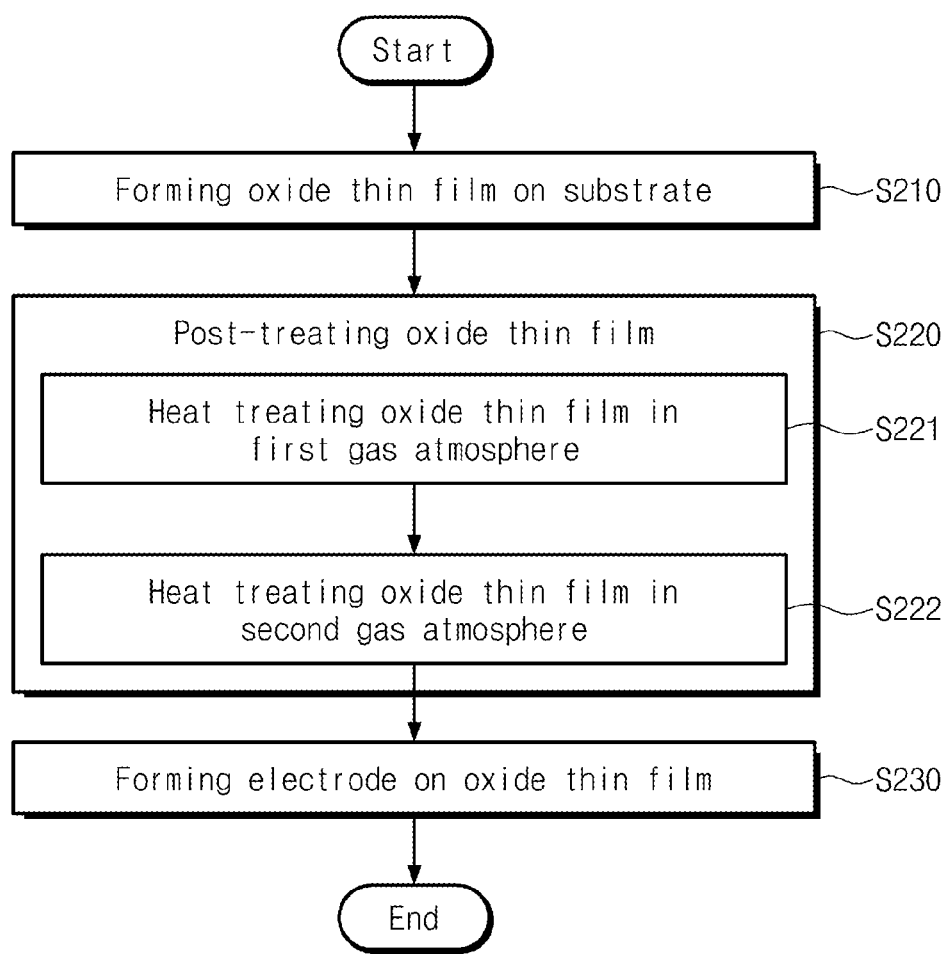
FIG. 5 is an exemplary flowchart of a method of manufacturing a semiconductor device according to an embodiment.

FIG. 5 is an exemplary flowchart of a method of manufacturing a semiconductor device 200 according to an embodiment;

As shown in FIG. 5, the method of manufacturing a semiconductor device 200 may include a step of forming an oxide thin film on a substrate (S210), a step of post-treating the oxide thin film (S220) and a step of forming an electrode on the oxide thin film (S230).

The step of post-treating the oxide thin film (S220) may include a step of heat treating the oxide thin film in a first gas atmosphere (S221) and a step of heat treating the oxide thin film in a second gas atmosphere (S222), and a material forming the second gas may have higher diffusion activation energy than a material forming the first gas.

The step of post-treating the oxide thin film (S220) corresponds to a method for post-treating an oxide thin film 100 explained referring to FIGS. 1 to 4.

According to an embodiment, the step of forming the oxide thin film on the substrate (S210) may include a step of forming an InZnO thin film on the substrate, however the kind of the oxide thin film is not limited thereto.

The step of forming the InZnO thin film on the substrate may include a step of coating a metal precursor solution obtained by dissolving an indium precursor and a zinc precursor in a solvent on the substrate, and a step of heat treating the substrate coated with the metal precursor solution. That is, the thin film formed on the substrate may be formed though a solution process, however the forming method of the thin film is not limited thereto.

In the case that the InZnO thin film is formed through the solution process, the molar concentration of the metal precursor solution may be from about 0.1 to about 0.5 M, however the molar concentration of a solution is not limited thereto.

The molar ratio of indium and zinc dissolved in the metal precursor solution may be from about 1:5 to about 5:1, however the molar ratio between the metals is not limited thereto.

According to an embodiment, about 0.06 g of nitric acid per 1 ml of a solvent may be added to the metal precursor solution, however the kind and amount of an additive added to the solution are not limited thereto.

In an embodiment, the step of heat treating the substrate coated with the metal precursor solution may include a step of pre-heat treating the substrate coated with the metal precursor solution at from about 100 to about 150° C. for from about 1 minute to about 5 minutes, and a step of post-heat treating the substrate coated with the metal precursor solution at from about 200 to about 280° C. for from about 2 hours to about 4 hours.

That is, the heat treatment performed to convert the metal precursor solution in a sol state into an oxide thin film with a gel state may be performed via multiple steps, however the heat treatment may be performed at once according to an embodiment.

Hereinafter, a process for manufacturing an oxide thin film transistor through the post-treatment of a thin film according to an embodiment of the inventive concept will be explained, and the electrical properties and reliability of the thin film transistor thus manufactured will be evaluated.

In an embodiment of the inventive concept, the oxide thin film was formed through a solution process, and hydrogen and oxygen were used as the first gas and the second gas, respectively.

First, in order to prepare a metal precursor solution, indium nitrate ($In(NO_3)_3$) and zinc nitrate ($Zn(NO_3)_2 \cdot 6H_2O$) as an indium precursor and a zinc precursor were dissolved in a 2-methoxyethanol solvent. In this case, the molar concentration of the metal precursor solution was about 0.3 M, and the molar ratio of indium and zinc was about 5:1. In addition, 0.06 g of nitric acid per 1 ml of 2-methoxyethanol was added as an additive to the metal precursor solution.

On a silicon substrate doped with p+, SiO2 was thermally grown to about 1,200 Å to form an insulation layer. Then, ultrasonic cleaning was performed with respect to the substrate using acetone, methanol and NaOH for about 10 minutes respectively, one by one, and blurring was performed using a nitrogen gun.

After that, a metal precursor solution was spin coated on the substrate. Spin coating was performed via 5 steps in total and at about 500 rpm for about 10 seconds, at about 1,500 rpm for about 15 seconds, at about 3,000 rpm for about 30 seconds, at about 1,500 rpm for about 15 seconds and at about 500 rpm for about 10 seconds.

Then, the substrate coated with the solution was heat treated in an atmosphere using a hot plate. The heat treatment was performed by pre-heat treating at about 100° C. for about 5 minutes and by post-heat treating at about 280° C. for about 4 hours.

The InZnO thin film thus manufactured was inserted in a chamber capable of heat treating at a high pressure, and post-treating was performed.

First, the InZnO thin film was heat treated in a hydrogen atmosphere after setting the pressure in the chamber to about 5, about 20 and about 40 atm, respectively at the temperature of about 200° C. for about 1 hour. Then, aluminum was evaporated on the thin film to a thickness of about 200 nm to form a source electrode and a drain electrode, and transfer curves of a thin film transistor were measured.

Figure 6:
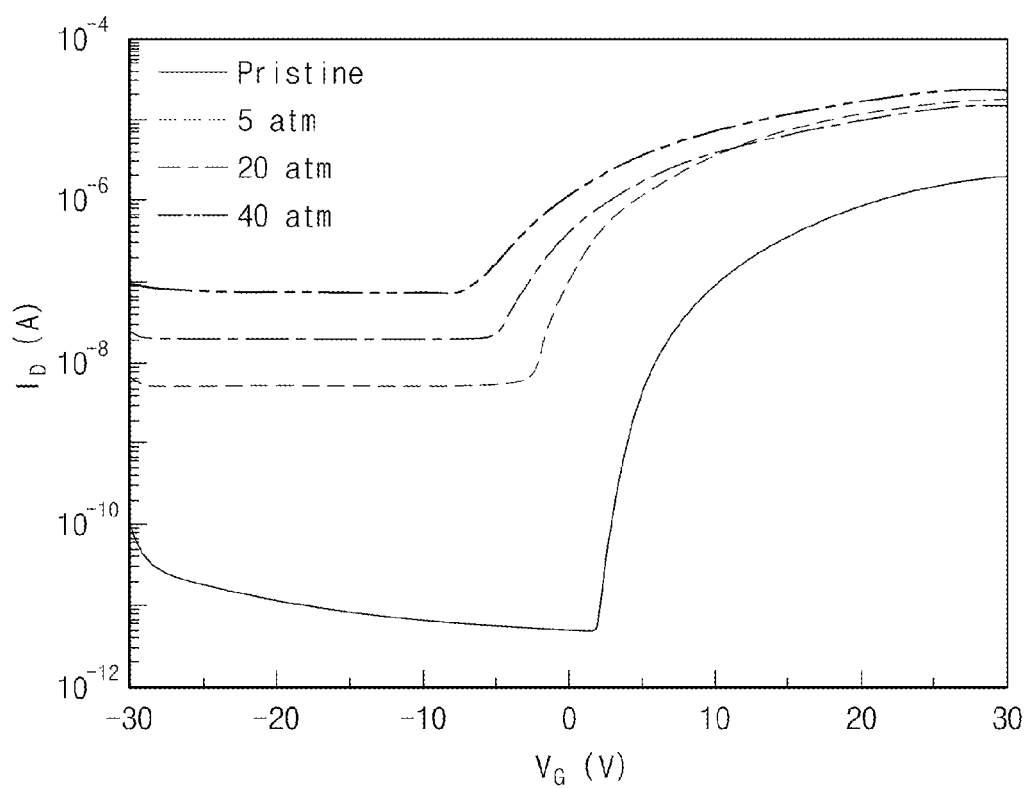
FIG. 6 illustrates transfer curves of an oxide thin film transistor obtained by heat treating an InZnO thin film in a hydrogen atmosphere at about 200° C. for about 1 hour while changing the pressure.

FIG. 6 illustrates transfer curves of an oxide thin film transistor obtained by heat treating an InZnO thin film in a hydrogen atmosphere at about 200° C. for about 1 hour while changing the pressure.

Referring to FIG. 6, it could be secured that the on-state current of a device which was post-treated in a hydrogen atmosphere was higher than a device which was not post-treated. Particularly, a device which was post-treated with the pressure of about 5 atm had similar on-state current and lower off-state current and so better performance when compared to a device which was post-treated with the pressure from about 20 to about 40 atm.

After heat treating the InZnO thin film in a hydrogen atmosphere at about 5 atm for about 1 hour while setting the heat treating temperature to about 100, about 150, about 200 and about 250° C., source and drain electrodes were formed on the thin film. Then, the transfer curves of a thin film transistor were measured.

Figure 7:
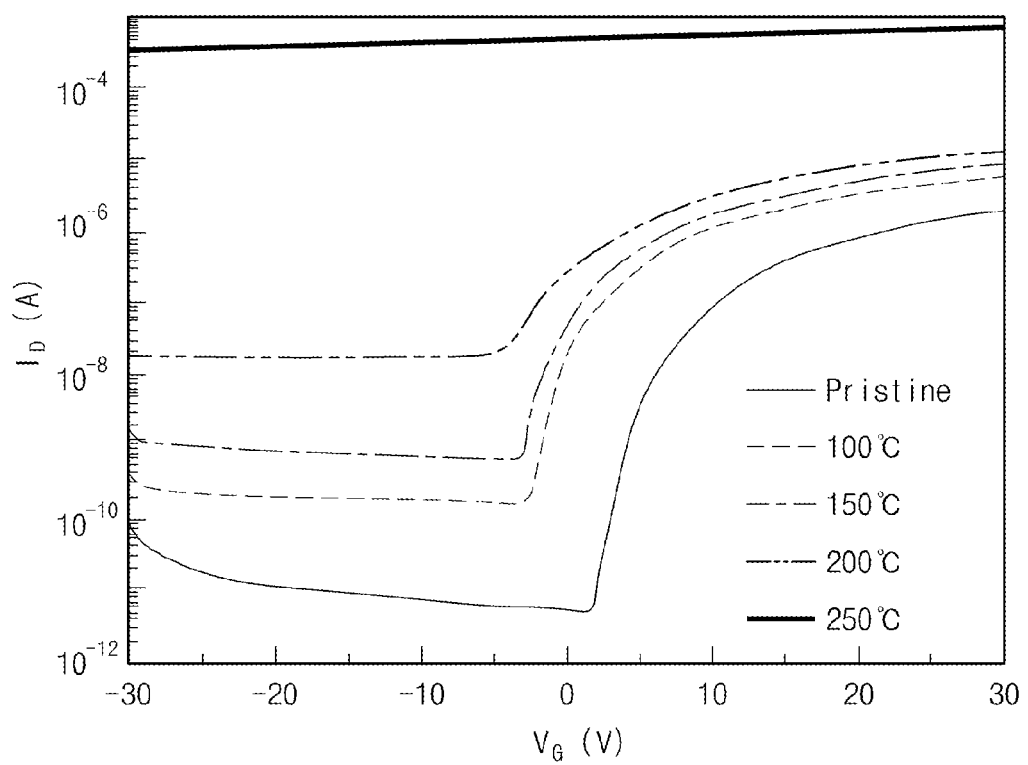
FIG. 7 illustrates transfer curves of an oxide thin film transistor obtained by heat treating an InZnO thin film at about 5 atm in a hydrogen atmosphere for about 1 hour while changing the temperature.

FIG. 7 illustrates transfer curves of an oxide thin film transistor obtained by heat treating an InZnO thin film at about 5 atm in a hydrogen atmosphere for about 1 hour while changing the temperature.

Referring to FIG. 7, the on-state current of a device which was post-treated in a hydrogen atmosphere was higher than a device which was not post-treated. Thus, it would be secured that the performance of a device might be increased by the post-treating.

Particularly, in the case that the heat treatment was performed at the temperature of about 200° C., the on-state current of the device was the highest. However, in the case that the temperature of heat treatment was set to about 250° C., little difference between an on-state current and an off-state current arose, and the device could not be used as a switching device.

Thus, in an embodiment of the inventive concept, an InZnO thin film was heat treated in a hydrogen atmosphere at about 200° C. for about 1 hour and then heat treated in an oxygen atmosphere.

The InZnO thin film heat treated in the hydrogen atmosphere was heat treated in the oxygen atmosphere while setting the pressure in a chamber to about 5, about 10 and about 20 atm at the temperature of about 200° C. for about 1 hour. Then, source and drain electrodes were formed on the thin film, and the transfer curves of the thin film transistor were measured.

Figure 8:
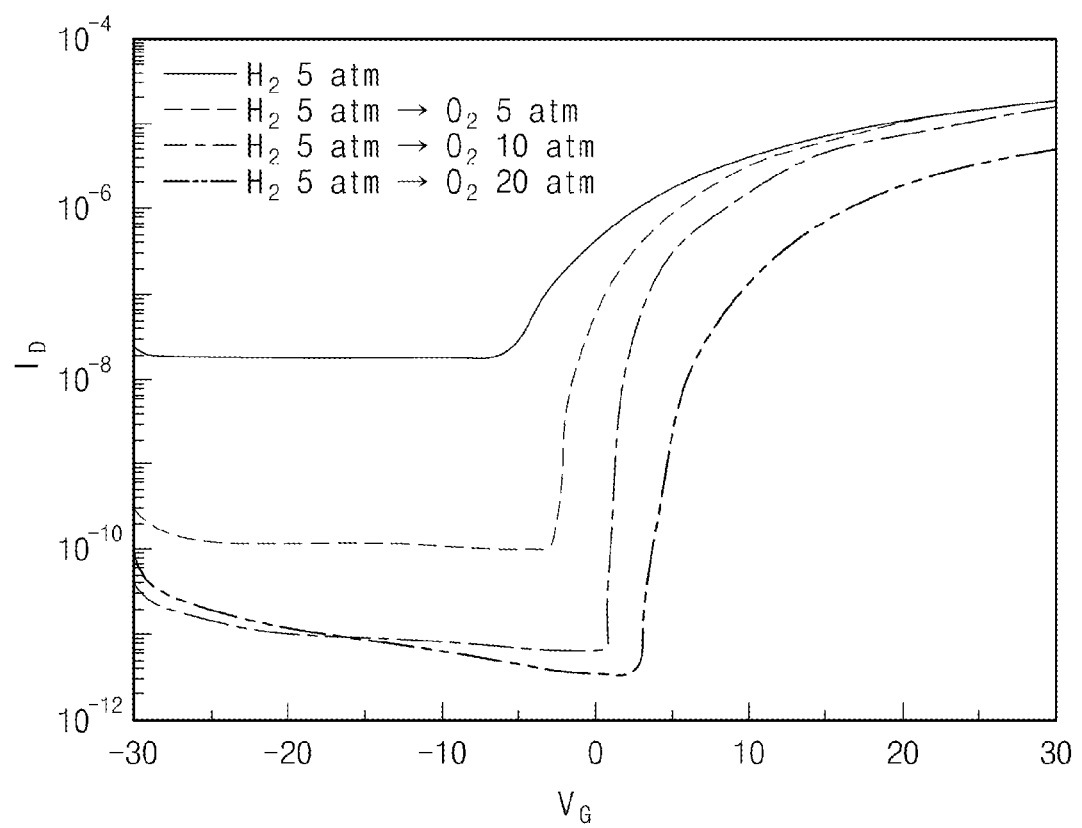
FIG. 8 illustrates transfer curves of an oxide thin film transistor obtained by heat treating an InZnO thin film in a hydrogen atmosphere and then heat treating in an oxygen atmosphere at about 200° C. for about 1 hour while changing the pressure.

FIG. 8 illustrates transfer curves of an oxide thin film transistor obtained by heat treating an InZnO thin film in a hydrogen atmosphere and then heat treating in an oxygen atmosphere at about 200° C. for about 1 hour while changing the pressure.

Referring to FIG. 8, the off-state current of a device heat treated in the oxygen atmosphere further was secured to decrease largely when compared to a device heat treated only in the hydrogen atmosphere. Particularly, the on/off current ratio of a device was largely improved while not decreasing the on-state current in a case that heat treatment was performed in the oxygen atmosphere further at about 10 atm when compared to a case that heat treatment was performed only in the hydrogen atmosphere.

From the experimental results, it would be found that the electrical performance of a device was the best when the post-treating of the thin film using hydrogen and oxygen was performed by heat treating in the hydrogen atmosphere at about 5 atm at about 200° C. for about 1 hour and then heat treating in the oxygen atmosphere at about 10 atm at about 200° C. for about 1 hour.

Figure 9:
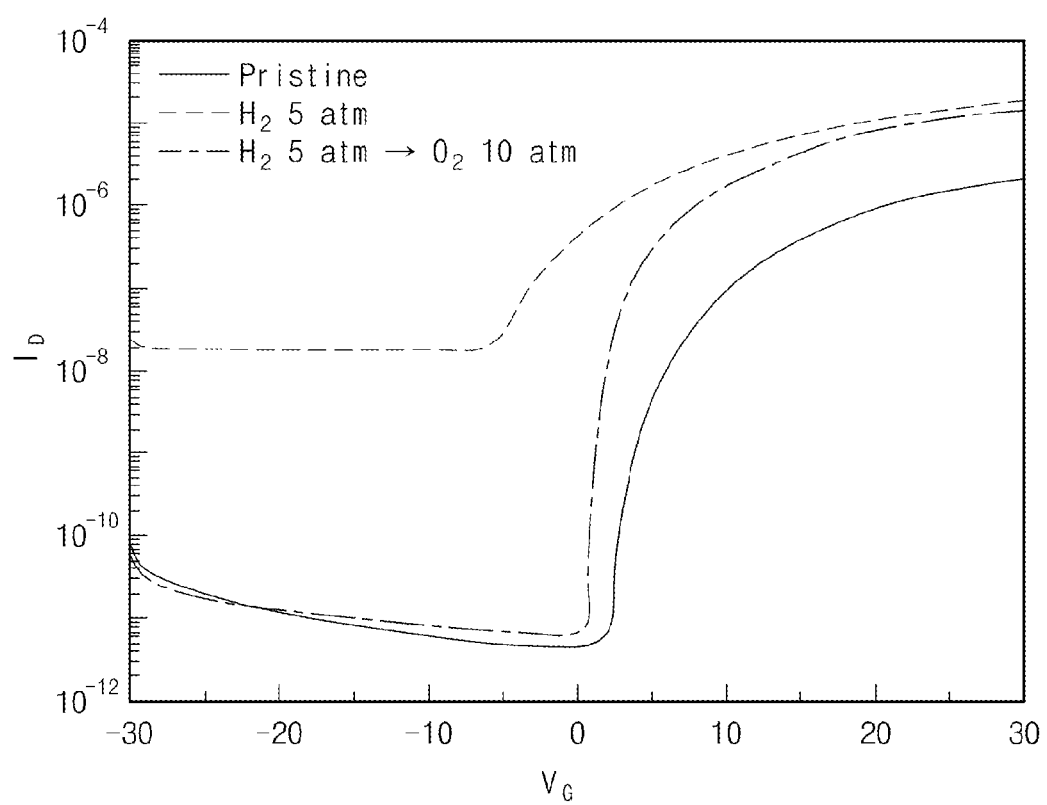
FIG. 9 illustrates transfer curves of an oxide thin film transistor in which an InZnO thin film is not post-treated and an oxide thin film transistor in which an InZnO thin film was heat treated in a hydrogen atmosphere and then heat treated in an oxygen atmosphere according to an embodiment.

FIG. 9 illustrates transfer curves of an oxide thin film transistor in which an InZnO thin film was not post-treated and an oxide thin film transistor in which an InZnO thin film was heat treated in a hydrogen atmosphere and then heat treated in an oxygen atmosphere according to an embodiment.

In the following Table 1, the mobility, the threshold voltage, the on/off current ratio, the subthreshold voltage swing and the trap density in the thin film of an oxide thin film transistor without post-treating, an oxide thin film transistor heat treated in a hydrogen atmosphere at about 5 atm for about 200° C. for about 1 hour, and an oxide thin film transistor heat treated in a hydrogen atmosphere and then heat treated in an oxygen atmosphere at about 10 atm at about 200° C. for about 1 hour, are illustrated.

TABLE 1

|  | Mobility (cm²/V) | Threshold voltage (V) | On/off current ratio | Subthreshold voltage swing (V/decade) | Trap density |
|---|---|---|---|---|---|
| Pristine | 0.04 | 5.73 | $4.53 \times 10^5$ | 0.97 | $2.61 \times 10^{12}$ |
| Heat treatment in hydrogen atmosphere | 0.20 | −4.56 | $8.86 \times 10^2$ | 3.44 | $9.67 \times 10^{12}$ |
| Heat treatment in hydrogen and oxygen atmosphere | 0.35 | 2.56 | $2.32 \times 10^6$ | 0.55 | $1.41 \times 10^{12}$ |

Referring to FIG. 9 and Table 1, when the thin film was post treated according to an embodiment of the inventive concept, the mobility and the on/off current ratio were increased, the trap density was decreased, and so the electrical performance of a device was improved when compared to the thin film not post-treated and the thin film post-treated only in the hydrogen atmosphere.

In order to evaluate the reliability of the device, positive bias stress (PBS) test and negative bias stress (NBS) test were performed.

For the PBS test, about 20 V and about 0.1 V were applied to a gate and a drain, respectively, and the transfer curves of a device were obtained after about 1, about 10, about 100 and about 1,000 seconds and the change amount of a threshold voltage, $\Delta V_{th}$ was measured. For the NBS test, about −20 V and about 10.1 V were applied to a gate and a drain, respectively, and the transfer curves of a device were obtained after about 1, about 10, about 100 and about 1,000 seconds and the change amount of a threshold voltage, $\Delta V_{th}$ was measured.

Figure 10:
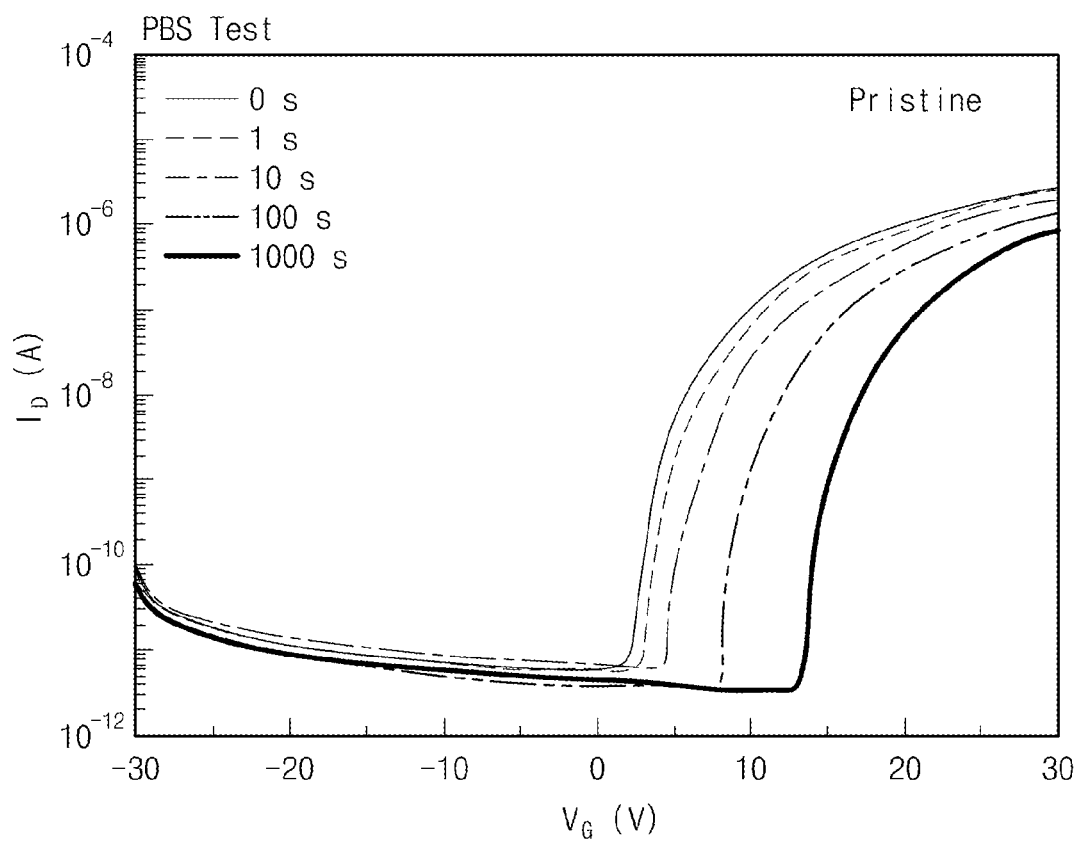
FIG. 10 illustrates graphs showing the PBS test results of an oxide thin film transistor in which an InZnO thin film is not post-treated.
Figure 11:
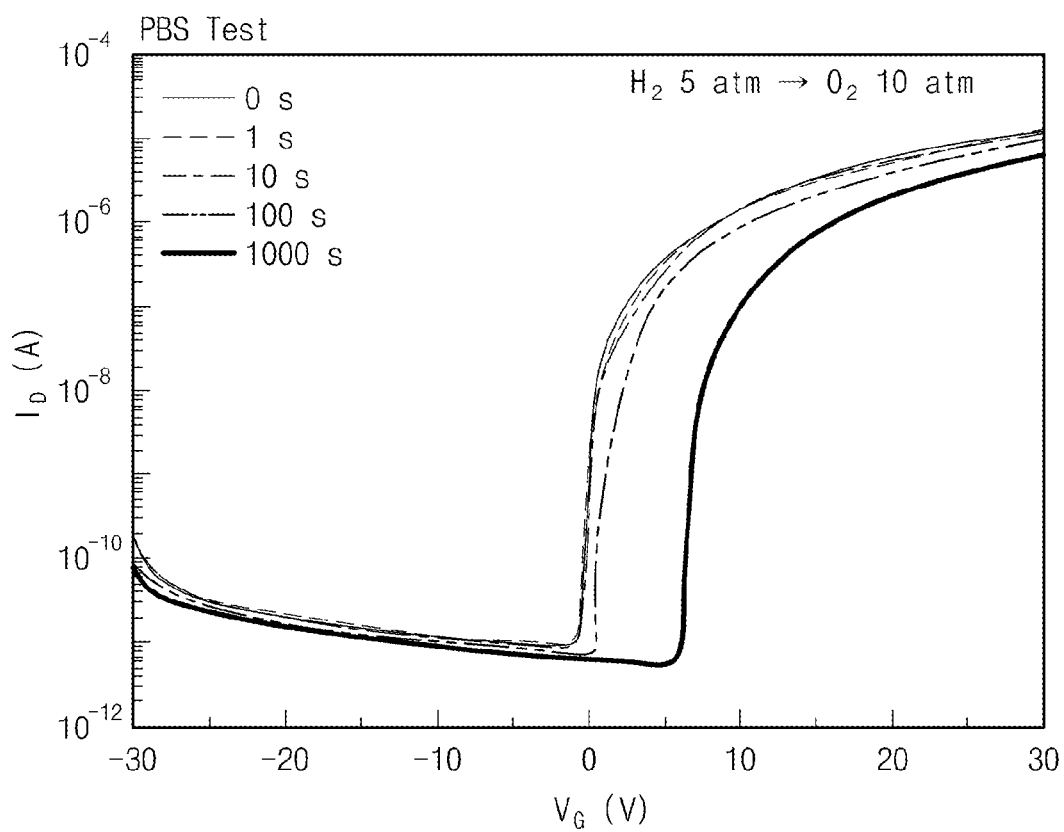
FIG. 11 illustrates graphs showing the PBS test results of an oxide thin film transistor obtained by heat treating an InZnO thin film in a hydrogen atmosphere and then heat treating in an oxygen atmosphere according to an embodiment.

FIG. 10 illustrates graphs showing the PBS test results of an oxide thin film transistor in which an InZnO thin film is not post-treated, and FIG. 11 illustrates graphs showing the PBS test results of an oxide thin film transistor obtained by heat treating an InZnO thin film in a hydrogen atmosphere and then heat treating in an oxygen atmosphere according to an embodiment.

In the following Table 2, the change amount of a threshold voltage, $\Delta V_{th}$ measured by the PBS test with respect to an oxide thin film transistor without post-treating and an oxide thin film transistor heat treated in a hydrogen atmosphere at about 5 atm at the temperature of about 200° C. for about 1 hour and then heat treated in an oxygen atmosphere at about 10 atm at the temperature of about 200° C. for about 1 hour, are illustrated.

TABLE 2

|  | Elapsed time (s) | $\Delta V_{th}$ (V) |
|---|---|---|
| Pristine | 1 | 1.1 |
|  | 10 | 2.7 |
|  | 100 | 6.5 |
|  | 1,000 | 11.1 |
| Heat treatment in hydrogen and oxygen atmosphere | 1 | 0.1 |
|  | 10 | 0.3 |
|  | 100 | 1.12 |
|  | 1,000 | 5.6 |

Figure 12:
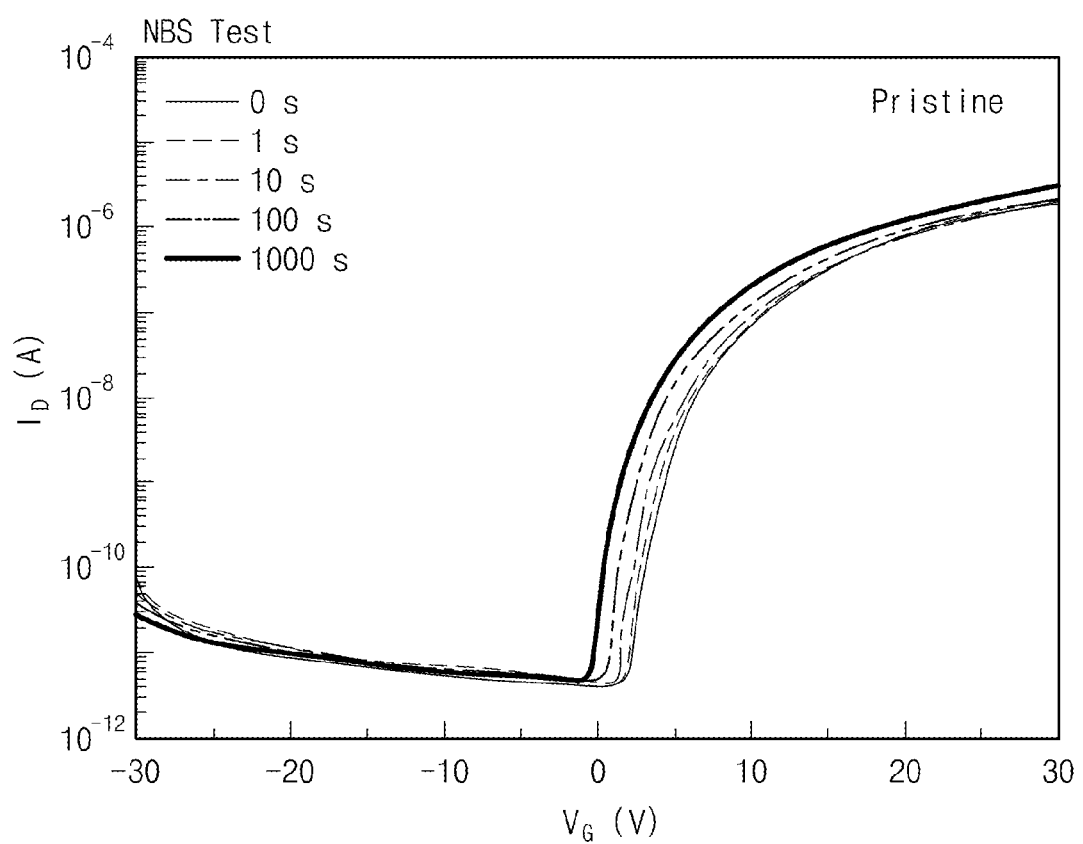
FIG. 12 illustrates graphs showing the NBS test results of an oxide thin film transistor in which an InZnO thin film is not post-treated.
Figure 13:
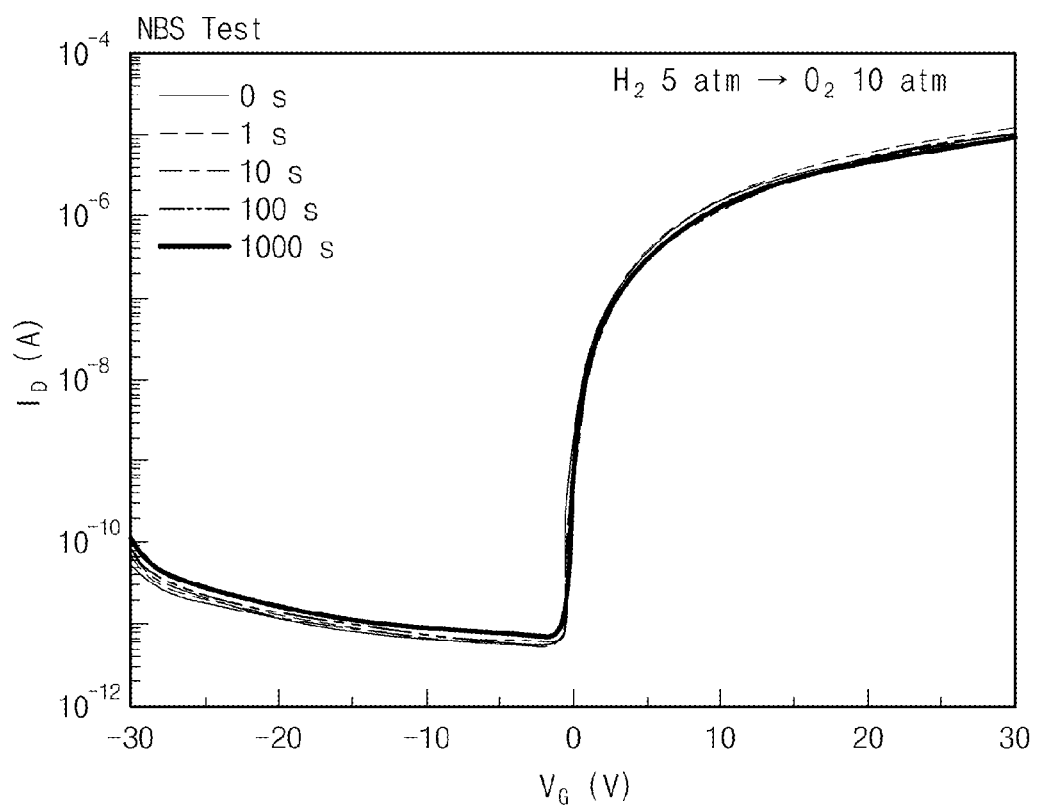
FIG. 13 illustrates graphs showing the NBS test results of an oxide thin film transistor obtained by heat treating an InZnO thin film in a hydrogen atmosphere and then heat treating in an oxygen atmosphere according to an embodiment.

FIG. 12 illustrates graphs showing the NBS test results of an oxide thin film transistor in which an InZnO thin film is not post-treated, and FIG. 13 illustrates graphs showing the NBS test results of an oxide thin film transistor obtained by heat treating an InZnO thin film in a hydrogen atmosphere and then heat treating in an oxygen atmosphere according to an embodiment.

In addition, in the following Table 3, the change amount of a threshold voltage, $\Delta V_{th}$ measured by the NBS test with respect to an oxide thin film transistor without post-treating and an oxide thin film transistor heat treated in a hydrogen atmosphere at about 5 atm at the temperature of about 200° C. for about 1 hour and then heat treated in an oxygen atmosphere at about 10 atm at the temperature of about 200° C. for about 1 hour, are illustrated.

TABLE 3

|  | Elapsed time (s) | $\Delta V_{th}$ (V) |
|---|---|---|
| Pristine | 1 | −0.3 |
|  | 10 | −0.8 |
|  | 100 | −1.6 |
|  | 1,000 | −2.86 |
| Heat treatment in hydrogen and oxygen atmosphere | 1 | −0.02 |
|  | 10 | −0.02 |
|  | 100 | −0.04 |
|  | 1,000 | −0.1 |

Referring to FIGS. 10 to 13 and Tables 2 and 3, it would be found that a device in which a thin film was post-treated had a smaller change amount of a threshold voltage, $\Delta V_{th}$ than that of a device in which a thin film was not post-treated and had good stability and reliability.

Hereinabove, a method for post-treating an oxide thin film improving the electrical performance and reliability of a device through post-treating a thin film, and a method of manufacturing a semiconductor device were explained. According to an embodiment, a device having improved electrical properties and reliability as a thin film with a multilayer structure may be obtained even with a thin film with a single layer through the post-treating, and time for improving the performance of a device and costs may be decreased, thereby increasing productivity when compared to a device with a thin film having a multilayer structure.

An embodiment of the inventive concept further provides other than the method for post-treating an oxide thin film and a method of manufacturing a semiconductor device, a novel oxide thin film having different properties in regions having a different depth in the thin film due to the change of physical properties in a thickness direction of the oxide thin film with a single layer and an electronic apparatus using the same.

FIGS. 14 to 17 are exemplary cross-sectional views for explaining the change of the physical properties in the thickness direction of an oxide thin film according to an embodiment.

Figure 14:
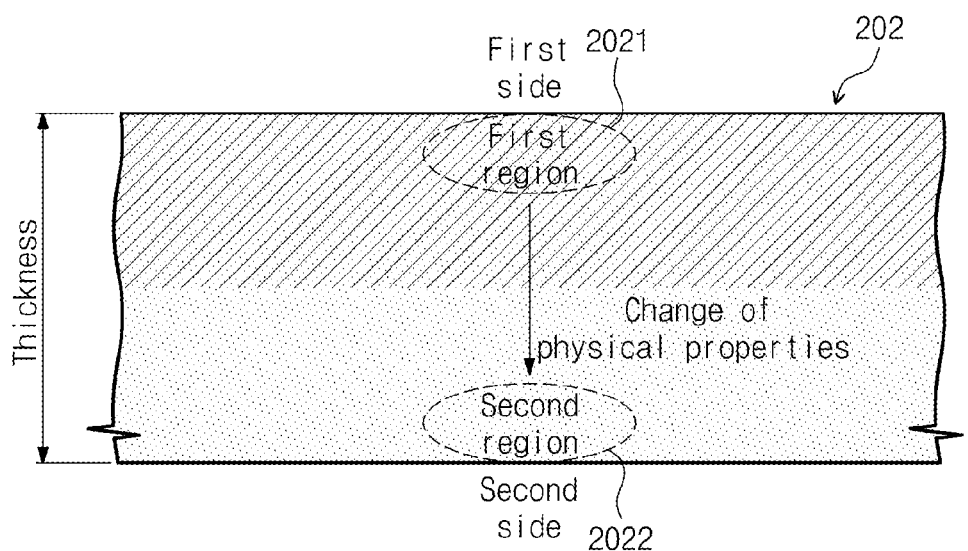
FIGS. 14 to 17 are exemplary cross-sectional views for explaining the change of the physical properties in the thickness direction of an oxide thin film according to an embodiment.

Referring to FIG. 14, an oxide thin film 202 according to an embodiment of the inventive concept is an oxide thin film with a single layer including a metal oxide, and physical properties thereof change in the thickness direction thereof.

For example, the physical properties of the oxide thin film 202 may tend to increase or decrease from a first region 2021 to a second region 2022 facing in the thickness direction. In other words, the oxide thin film 202 according to an embodiment of the inventive concept does not have constant physical properties but changing physical properties in the thickness direction throughout the thin film.

Here, the oxide thin film 202 may include a homogeneous metal oxide.

According to an embodiment, the first region 2021 may be positioned adjacent to one side of the oxide thin film 202 (for example, a top side making contact with a process gas during post-treating), and the second region 2022 may be positioned adjacent to a second side of the oxide thin film 202 (for example, a bottom side making contact with the substrate or other thin film). That is, the physical properties of the oxide thin film 202 according to an embodiment of the inventive concept may change across the whole thickness of the thin film. However, the physical properties may change locally across a portion of the thickness of the thin film according to an embodiment.

According to an embodiment of the inventive concept, the amount of oxygen vacancies may change in the oxide thin film 202 in the thickness direction thereof.

Figure 15:
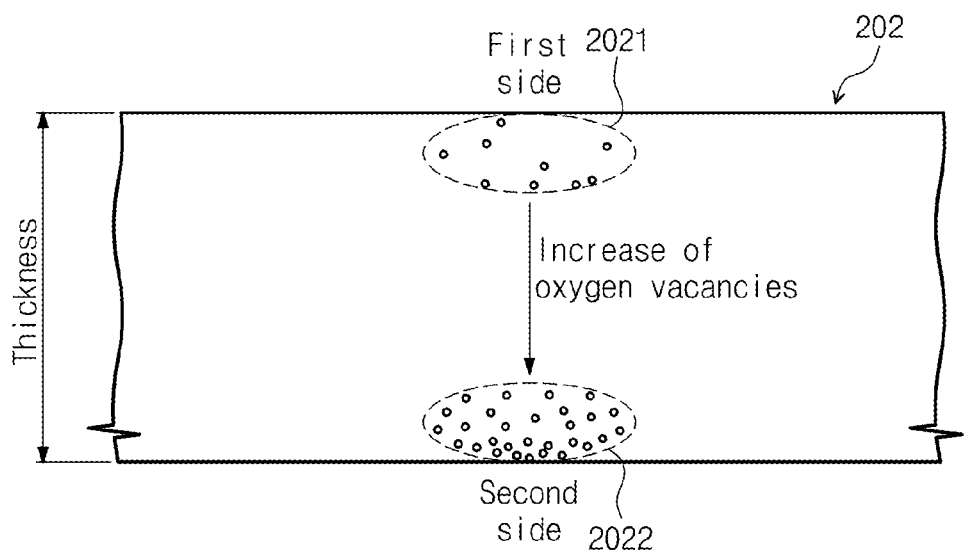

For example, referring to FIG. 15, the amount of the oxygen vacancies in the thin film may tend to increase from the first region 2021 to the second region 2022 in the oxide thin film 202.

According to another embodiment of the inventive concept, the amount of bonds between a metal and oxygen may change in the thickness direction of the oxide thin film 202.

Figure 16:
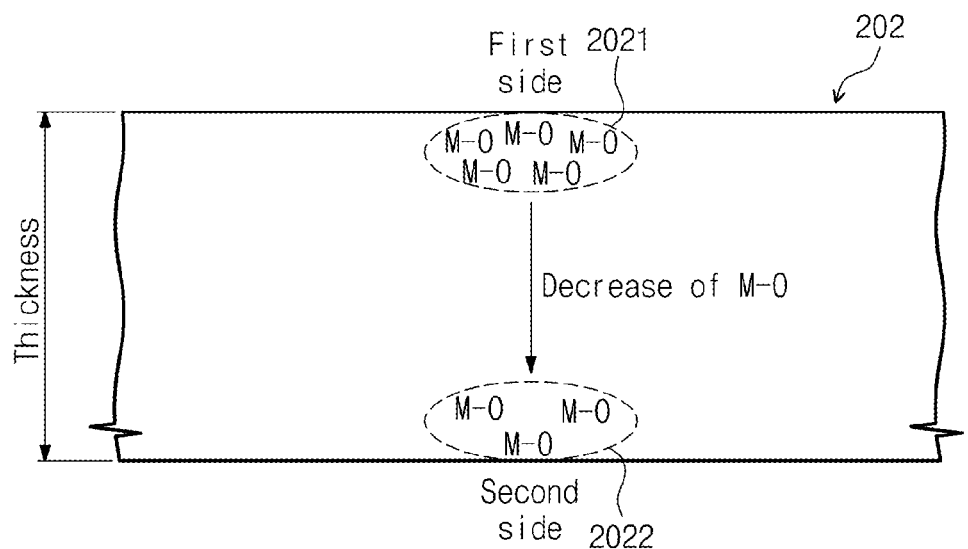

For example, referring to FIG. 16, the amount of the bonds between the metal and oxygen (M-O) in the oxide thin film 202 may tend to decrease from the first region 2021 to the second region 2022.

According to another embodiment of the inventive concept, the amount of hydroxyl groups may change in the oxide thin film 202 in the thickness direction thereof.

Figure 17:
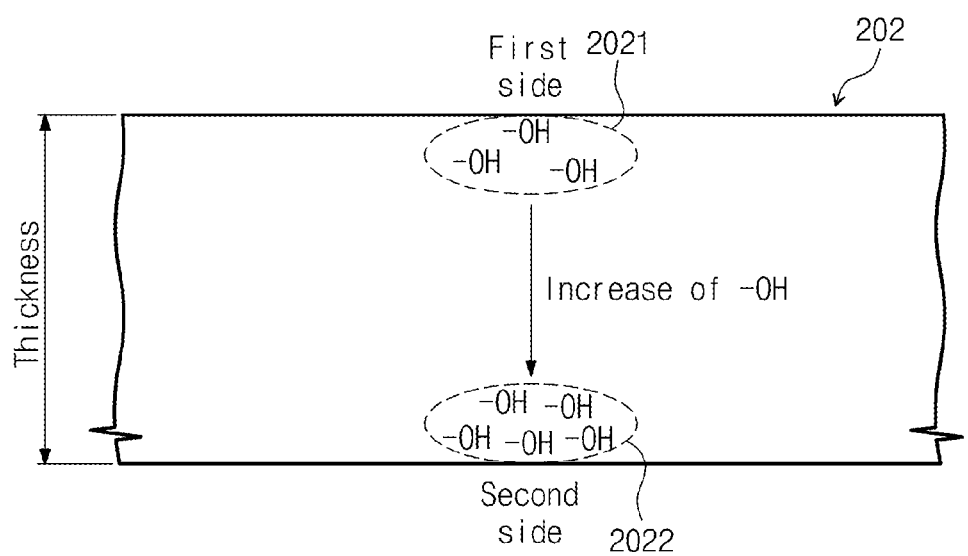

Referring to FIG. 17, the amount of the hydroxyl groups in the thin film may tend to increase in the oxide thin film 202 from the first region 2021 to the second region 2022.

According to an embodiment of the inventive concept, physical properties in the oxide thin film 202 may tend to gradually increase or decrease from the first region 2021 to the second region 2022. That is, the physical properties such as the oxygen vacancies, the bonds between the metal and the oxygen and the amount of the hydroxyl groups may gradually change dependent on the depth of the oxide thin film 202 from the first region 2021 to the second region 2022.

According to an embodiment, the physical properties may rapidly change or gently change depending on the depth in the thin film in a certain thickness range instead of changing gradually. In other words, according to an embodiment, the degree of the change of the physical properties may be different depending on the thickness range of the thin film.

The oxide thin film 202 according to the above-described embodiment of the inventive concept may be obtained through a method for post-treating an oxide thin film 100 explained referring to FIGS. 1 to 4.

For example, a thin film is formed on the substrate 201 as a single layer, and the thin film is heat treated in a first gas (for example, hydrogen) atmosphere and heat treated in a second gas (for example, oxygen) atmosphere so that the oxide thin film 202 with the single layer may have different physical properties depending on the depth.

However, a method of obtaining the oxide thin film 202 is not limited to the above-mentioned method for post-treating the oxide thin film 100, and an oxide thin film obtained via other methods may be included in the oxide thin film 202 according to an embodiment of the inventive concept.

Hereinafter, spectroscopic analysis was performed with respect to an oxide thin film obtained via post-treating according to an embodiment of the inventive concept and an oxide thin film without post-treating, and physical properties of the oxide thin film according to an embodiment and the oxide thin film according to a comparative embodiment will be compared.

The oxide thin film was an InZnO thin film, and the manufacture of the oxide thin film and the post-treating were performed according to the same procedure described in the above embodiments. The heat treating using hydrogen was performed in a hydrogen atmosphere at about 5 atm at the temperature of about 200° C. for about 1 hour, and the heat treating using oxygen was performed in an oxygen atmosphere at about 10 atm at the temperature of about 200° C. for about 1 hour.

Figure 18:
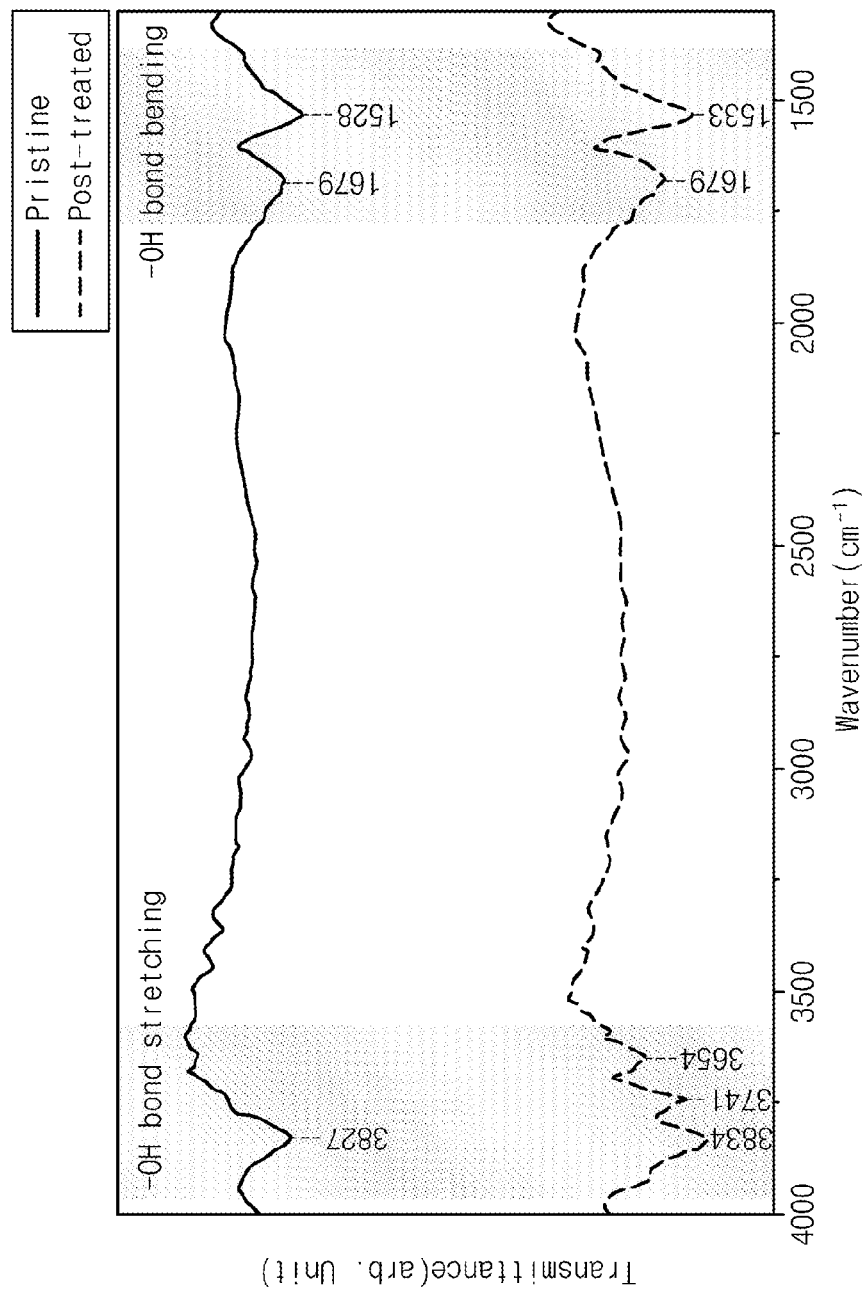
FIG. 18 is a Fourier Transform Infrared (FT-IR) spectrum for observing hydroxyl groups in an InZnO thin film which is not post-treated according to a comparative embodiment and an InZnO thin film which is post-treated according to an embodiment.

FIG. 18 is a Fourier Transform Infrared (FT-IR) spectrum for observing hydroxyl groups in an InZnO thin film which is not post-treated according to a comparative embodiment and an InZnO thin film which is post-treated according to an embodiment.

Referring to FIG. 18, in the thin film post-treated according to an embodiment, more minimum peaks of transmittance were observed in a wavenumber region corresponding to the —OH bond with a stretching structure and a wavenumber region corresponding to the —OH bond with a bending structure when compared to the thin film not post-treated according to a comparative embodiment. Further, the transmittance of the thin film of the embodiment is lower than that of the thin film of the comparative embodiment.

From this, it may be found that more hydroxyl groups are present in the thin film of the embodiment than the thin film of the comparative embodiment.

Figure 19:
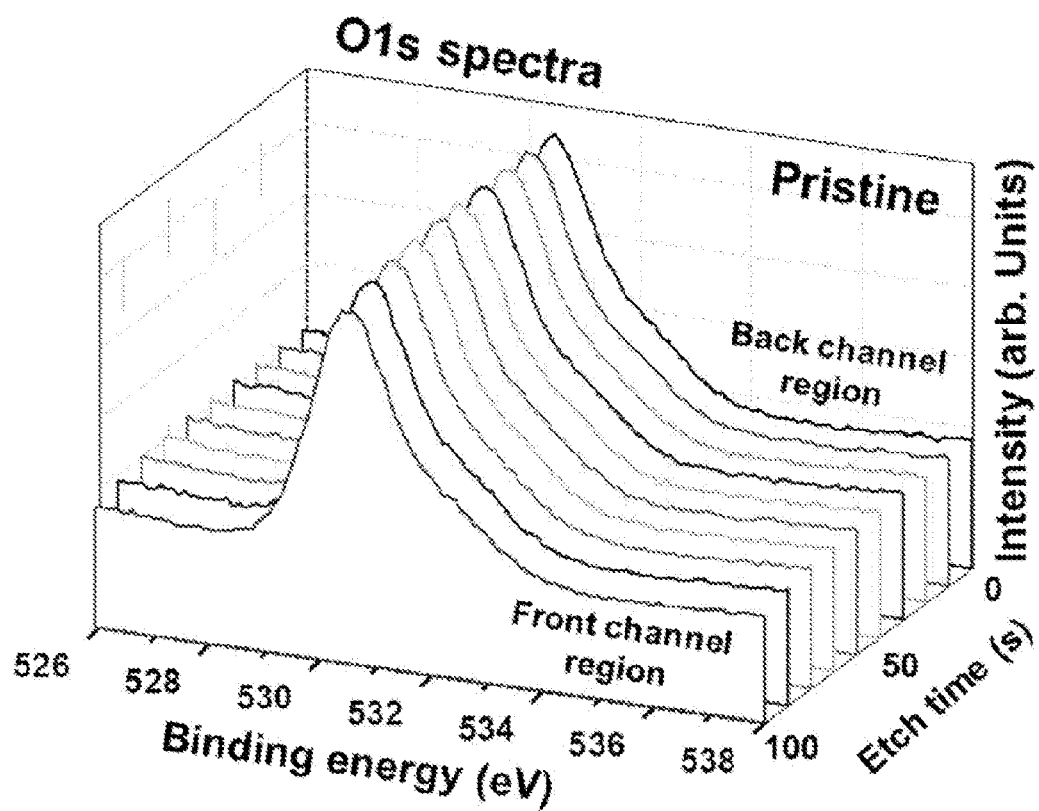
FIGS. 19 and 20 are graphs showing 01s spectra according to the depth of a thin film obtained from X-ray photoelectron spectroscope (XPS) with respect to an InZnO thin film which is not post-treated according to a comparative embodiment and an InZnO thin film which is post-treated according to an embodiment.
Figure 20:
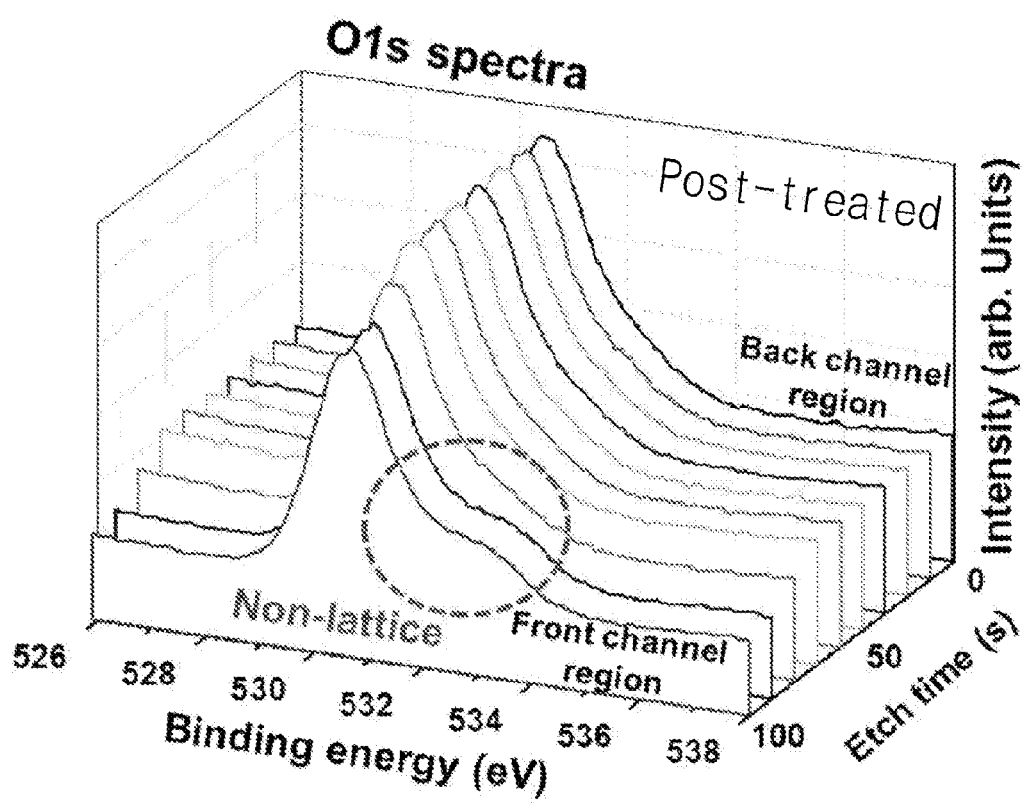

FIGS. 19 and 20 are graphs showing O1s spectra according to the depth of a thin film obtained from X-ray photoelectron spectroscope (XPS) with respect to an InZnO thin film which is not post-treated according to a comparative embodiment and an InZnO thin film which is post-treated according to an embodiment.

An XPS analysis was performed with respect to the surface of the thin film while etching thereof to obtain O1s spectra according to the depth. Particularly, the XPS analysis was performed while etching the thin film using Ar ions by means of a K-alpha apparatus of Thermo VG Co., at about 1 second, about 10 seconds, about 20 seconds, about 30 seconds, about 40 seconds, about 50 seconds, about 60 seconds, about 70 seconds, about 80 seconds, about 90 seconds and about 100 seconds.

When an etch time is short, the graph goes near an adjacent portion to the top side (that is, a side making contact with a process gas during post treating) of the thin film, and when an etch time increases, the graph goes near an adjacent portion of the bottom side (that is a side making contact with a substrate or other thin film) of the thin film. Here, an adjacent region to the top side of the thin film may be referred to as a back channel region, and an adjacent region to the bottom side of the thin film may be referred to as a front channel region.

Referring to FIG. 19, it would be secured that the spectra had a constant shape irrespective of the depth of the thin film of the comparative embodiment. On the contrary, referring to FIG. 20, binding energy corresponding to the oxygen bond of a lattice structure decreases, however binding energy corresponding to the oxygen bond of a non-lattice structure increases as the depth of the thin film of the embodiment increases.

The oxygen bonds of the lattice structure correspond to bonds between a metal and oxygen. In the oxygen bonds of the non-lattice structure, bonds between a metal and oxygen may not be formed, oxygen vacancies may be generated, and hydroxyl groups may be present.

On the basis of the XPS graph with respect to the depth of the thin film in FIGS. 19 and 20, it would be found that physical properties were constant throughout the thickness of the thin film in the comparative embodiment, and physical properties changed in the thickness direction of the thin film in the exemplary embodiment.

More particularly, as explained referring to FIGS. 15 to 17, in the thin film according to the embodiment, the amount of the oxygen vacancies increases, the amount of the bonds between the metal and the oxygen decreases, and the amount of the hydroxyl groups increases from the back channel region adjacent to the top side toward the front channel region adjacent to the bottom side.

In order to examine the change of the oxygen vacancies, the bonds between the metal and the oxygen and the hydroxyl groups in the thickness direction of the thin film, 01s spectrum with respect to each depth of the thin film was curve fitted by Gaussian distribution, and spectrum on the oxygen vacancies, spectrum on the bonds between the metal and the oxygen and spectrum on the hydroxyl groups were obtained.

Figure 21:
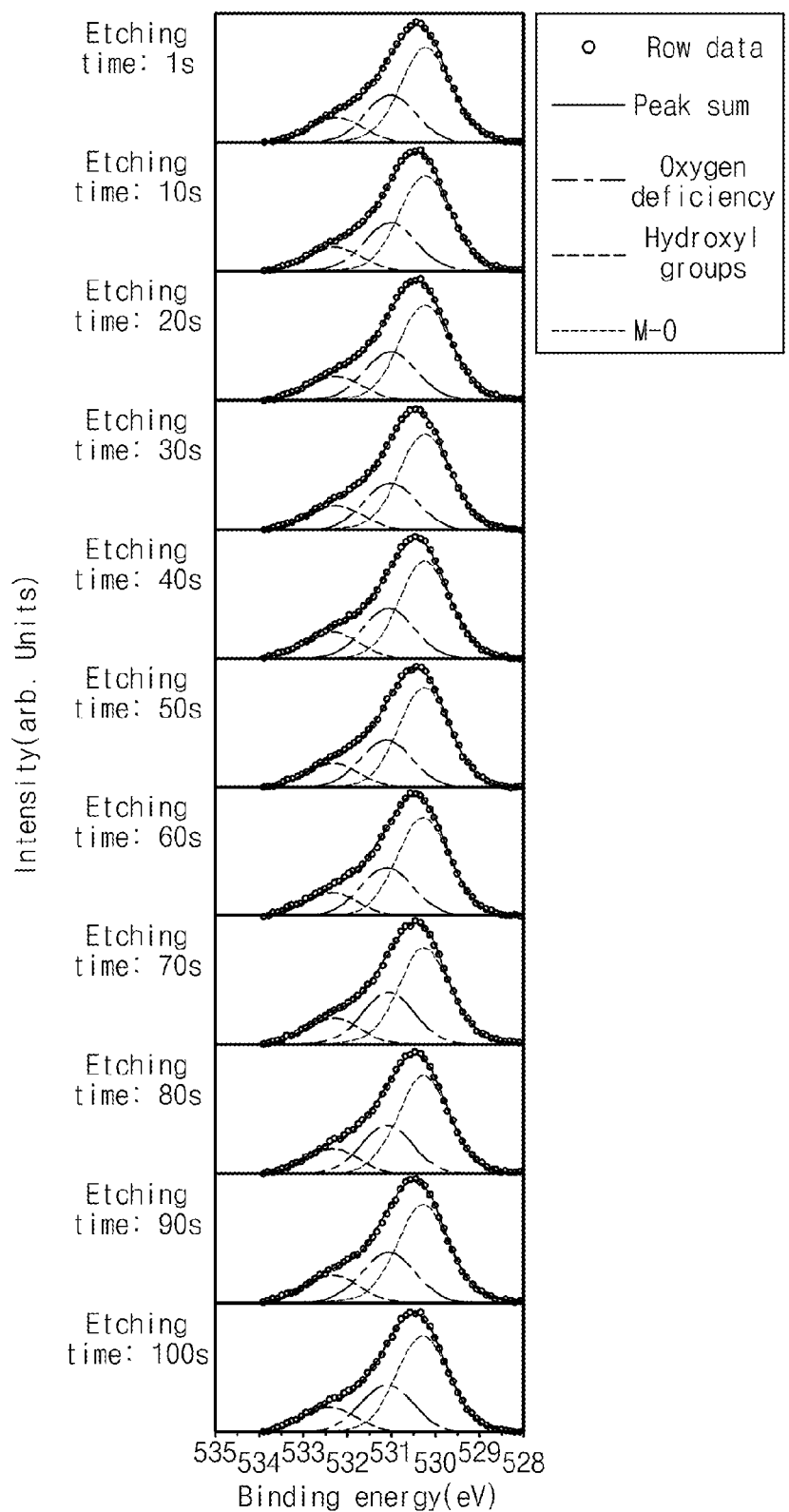
FIG. 21 illustrates graphs showing a 01s spectrum with respect to each depth of an InZnO thin film which is not post-treated according to a comparative embodiment, a spectrum on oxygen vacancies, a spectrum on bonds between a metal and oxygen and a spectrum on hydroxyl groups obtained from the 01s spectrum at each depth.
Figure 22:
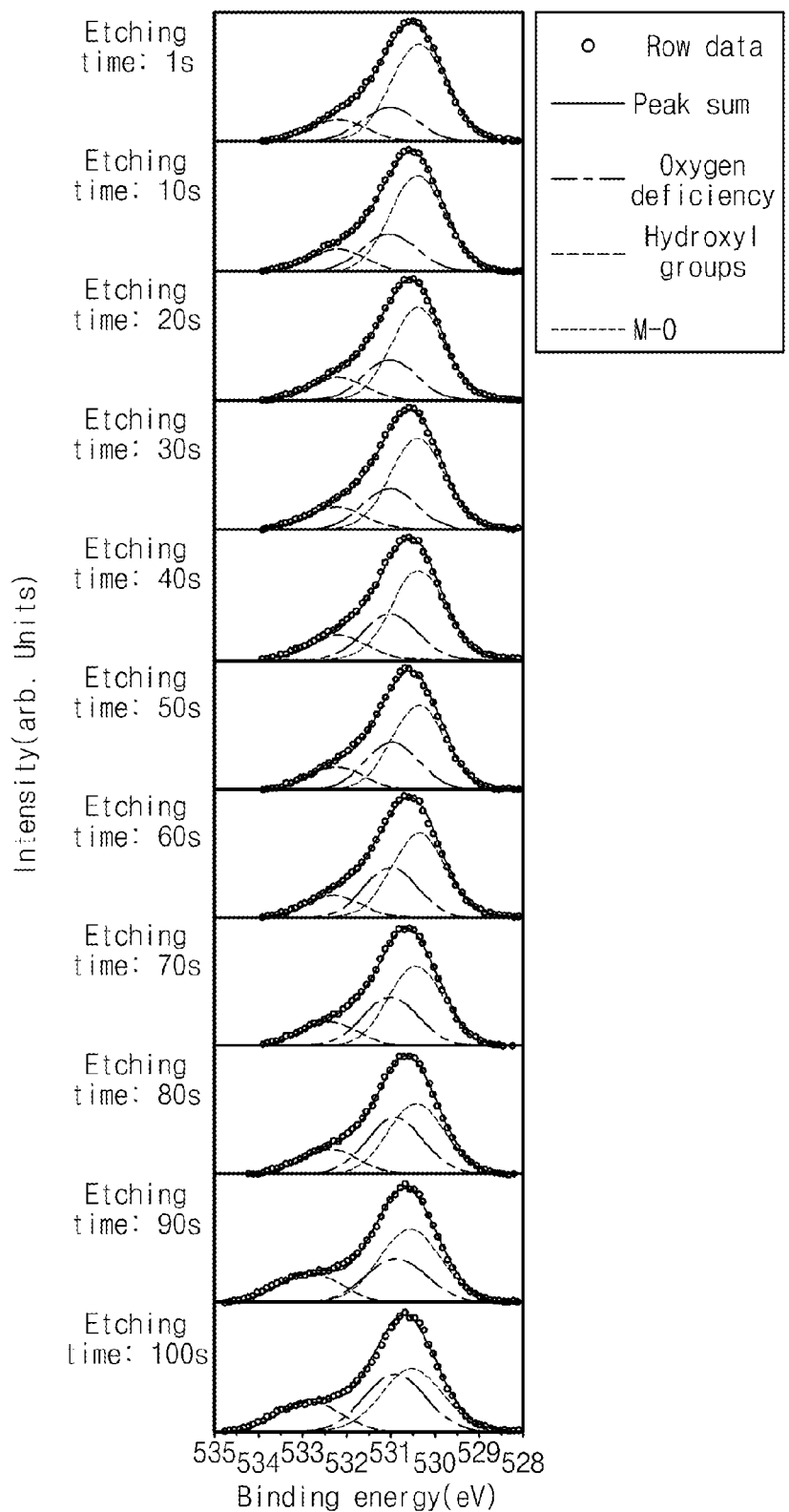
FIG. 22 illustrates graphs showing a 01s spectrum with respect to each depth of an InZnO thin film which is post-treated according to an embodiment, a spectrum on oxygen vacancies, a spectrum on bonds between a metal and oxygen and a spectrum on hydroxyl groups obtained from the 01s spectrum at each depth.

FIG. 21 illustrates graphs showing a 01s spectrum with respect to each depth of an InZnO thin film which is not post-treated according to a comparative embodiment, a spectrum on oxygen vacancies, a spectrum on bonds between a metal and oxygen and a spectrum on hydroxyl groups obtained from the 01s spectrum at each depth, and FIG. 22 illustrates graphs showing a 01s spectrum with respect to each depth of an InZnO thin film which is post-treated according to an embodiment, a spectrum on oxygen vacancies, a spectrum on bonds between a metal and oxygen and a spectrum on hydroxyl groups obtained from the 01s spectrum at each depth.

The sum of the areas of the spectrum on the oxygen vacancies, the spectrum on the bonds between the metal and the oxygen and the spectrum on the hydroxyl groups for each depth may be the same as the area of the 01s spectrum.

The percentage of the area of the spectrum on the oxygen vacancies with respect to the area of the 01s spectrum was calculated for each depth to obtain an area percentage occupied by the oxygen vacancies in a unit area for each depth of the thin film. Similarly, the percentage of the area of the spectrum on the bonds between the metal and the oxygen with respect to the area of the 01s spectrum was calculated for each depth to obtain an area percentage occupied by the bonds between the metal and the oxygen in a unit area for each depth of the thin film. In addition, the percentage of the area of the spectrum on the hydroxyl groups with respect to the area of the 01s spectrum was calculated for each depth to obtain an area percentage occupied by the hydroxyl groups in a unit area for each depth of the thin film.

Figure 23:
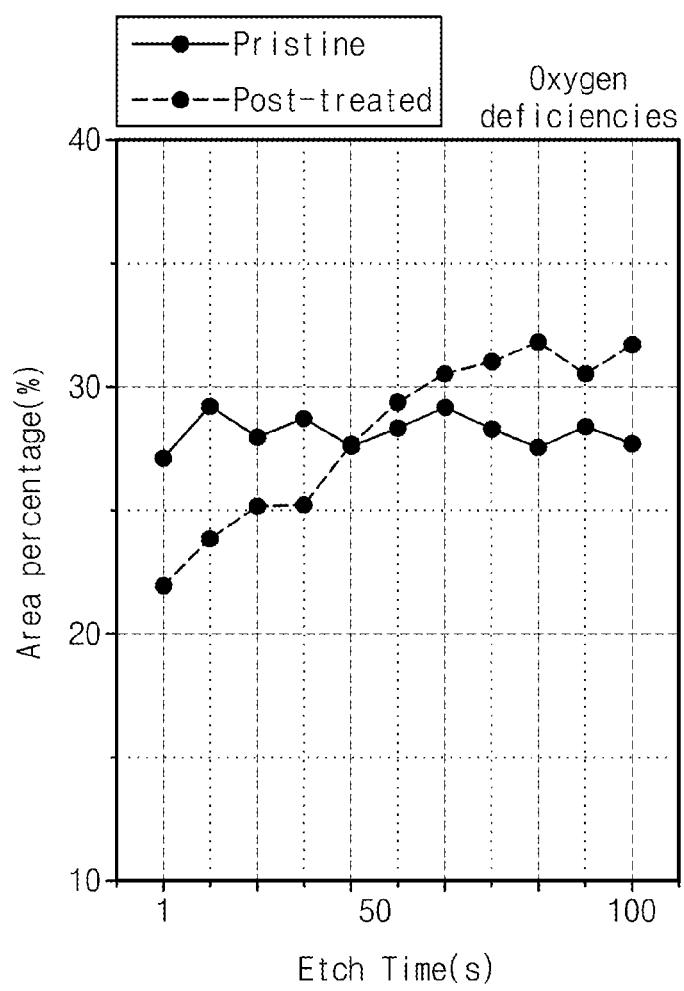
FIG. 23 is a graph showing the area percentage of oxygen vacancies according to the depth of an InZnO thin film according to a comparative embodiment and an InZnO thin film according to an embodiment.
Figure 24:
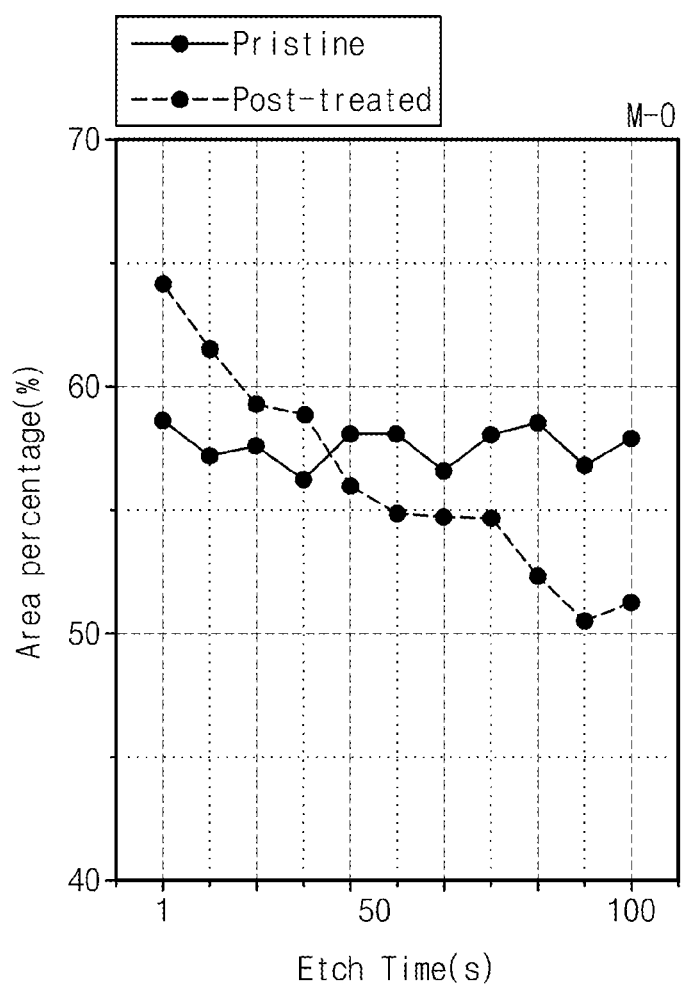
FIG. 24 is a graph showing the area percentage of bonds between a metal and oxygen according to the depth of an InZnO thin film according to a comparative embodiment and an InZnO thin film according to an embodiment.
Figure 25:
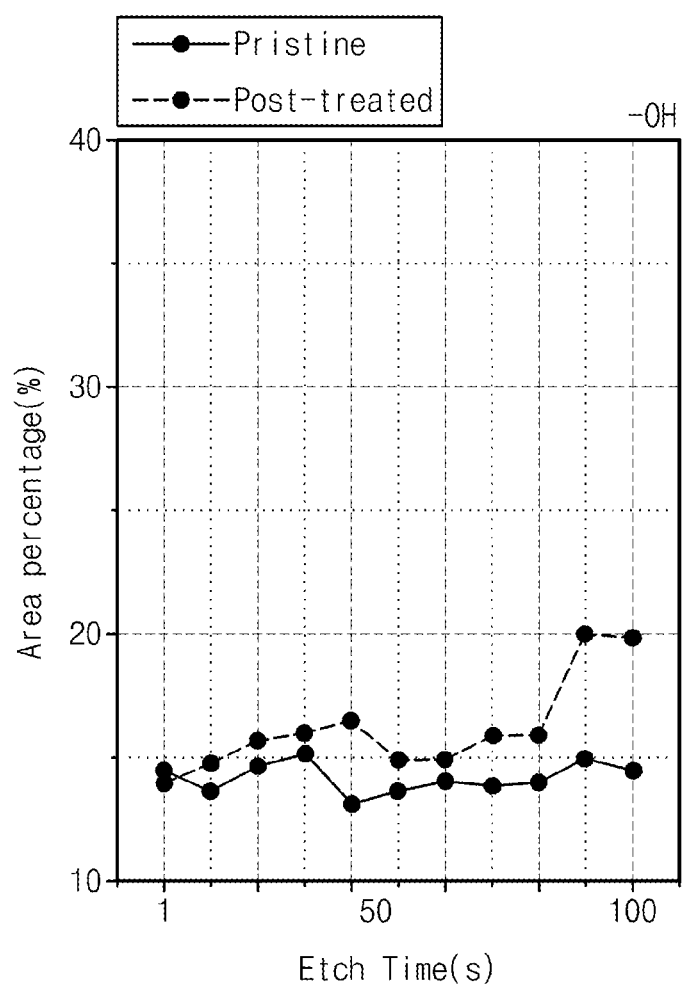
FIG. 25 is a graph showing the area percentage of hydroxyl groups according to the depth of an InZnO thin film according to a comparative embodiment and an InZnO thin film according to an embodiment.

FIG. 23 is a graph showing an area percentage of oxygen vacancies according to the depth of an InZnO thin film which is not post-treated according to a comparative embodiment and an InZnO thin film which is post-treated according to an embodiment, FIG. 24 is a graph showing an area percentage of bonds between a metal and oxygen according to the depth of an InZnO thin film according to a comparative embodiment and an InZnO thin film according to an embodiment, and FIG. 25 is a graph showing an area percentage of hydroxyl groups according to the depth of an InZnO thin film according to a comparative embodiment and an InZnO thin film according to an embodiment.

Referring to FIG. 23, the amount of the oxygen vacancies tended to be maintained constant in the thin film irrespective of the depth of the thin film in the comparative embodiment, however the amount of the oxygen vacancies tended to increase gradually as the depth of the thin film in the embodiment increases.

Referring to FIG. 24, the amount of the bonds between the metal and the oxygen tended to be maintained constant in the thin film irrespective of the depth of the thin film in the comparative embodiment, however the amount of the bonds between the metal and the oxygen tended to increase gradually as the depth of the thin film in the embodiment increases.

Referring to FIG. 25, the amount of the hydroxyl groups tended to be maintained constant in the thin film irrespective of the depth of the thin film in the comparative embodiment, however the amount of the hydroxyl groups tended to increase gradually as the depth of the thin film in the embodiment increases.

The area percentages of the oxygen vacancies, the bonds between the metal and the oxygen and the hydroxyl groups according to the comparative embodiment, and the area percentages of the oxygen vacancies, the bonds between the metal and the oxygen and the hydroxyl groups according to the embodiment with respect to each etch time illustrated in FIGS. 23 to 25 are shown in the following Table 4.

TABLE 4

| | Comparative Examples | | | Examples | | |
|---|---|---|---|---|---|---|
| Etch time (s) | Oxygen vacancies (%) | M—O bonds (%) | —OH (%) | Oxygen vacancies (%) | M—O bonds (%) | —OH (%) |
| 1 | 27.06 | 58.56 | 14.36 | 21.89 | 64.10 | 13.91 |
| 10 | 29.23 | 57.19 | 13.57 | 23.80 | 61.47 | 14.72 |
| 20 | 27.89 | 57.53 | 14.58 | 25.10 | 59.25 | 15.63 |
| 30 | 28.65 | 56.25 | 15.09 | 25.21 | 58.82 | 15.95 |
| 40 | 27.49 | 58.60 | 13.08 | 27.63 | 55.94 | 16.43 |
| 50 | 28.29 | 58.08 | 13.61 | 29.36 | 54.83 | 14.84 |
| 60 | 29.07 | 56.58 | 14.00 | 30.47 | 54.66 | 14.84 |
| 70 | 28.22 | 57.98 | 13.80 | 30.98 | 53.12 | 15.90 |
| 80 | 27.57 | 58.47 | 13.95 | 31.80 | 52.33 | 15.86 |
| 90 | 28.32 | 56.78 | 14.88 | 30.52 | 50.51 | 19.95 |
| 100 | 27.70 | 57.91 | 14.38 | 31.69 | 48.51 | 19.80 |

The above analysis data were derived on the basis of binding energy concerning oxygen in the thin film, however the same results may be obtained when examining binding energy concerning a metal in the thin film.

Figure 26:
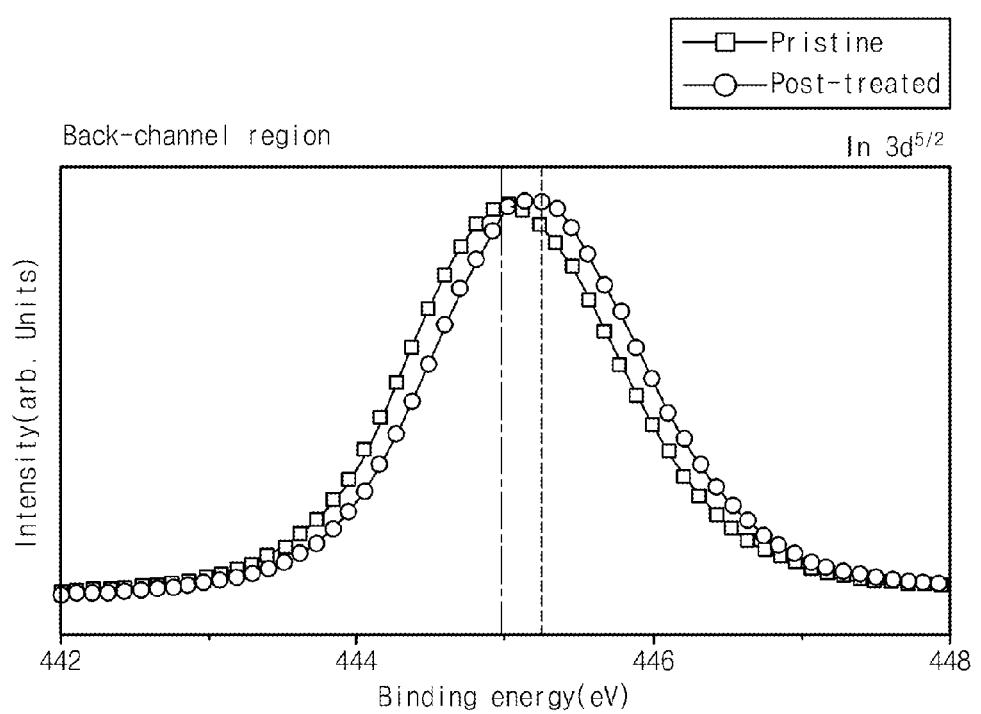
FIG. 26 is a graph showing In $3d^{5/2}$ spectra obtained through XPS with respect to the top side of an InZnO thin film according to a comparative embodiment and an InZnO thin film according to an embodiment.
Figure 27:
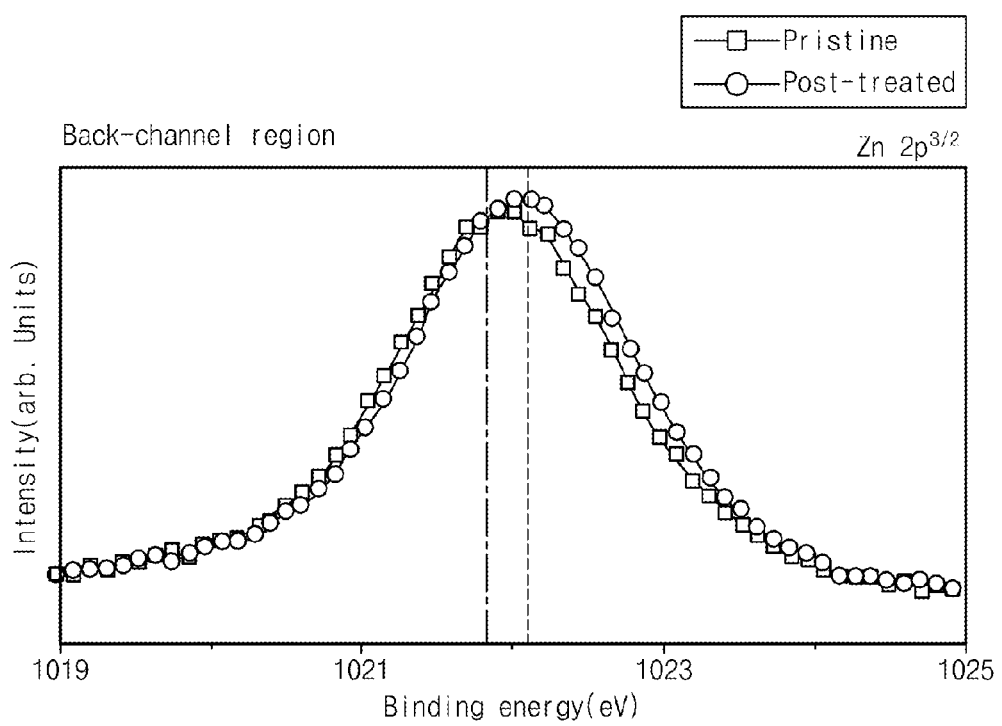
FIG. 27 is a graph showing Zn $2p^{3/2}$ spectra obtained through XPS with respect to the top side of an InZnO thin film according to a comparative embodiment and an InZnO thin film according to an embodiment.
Figure 28:
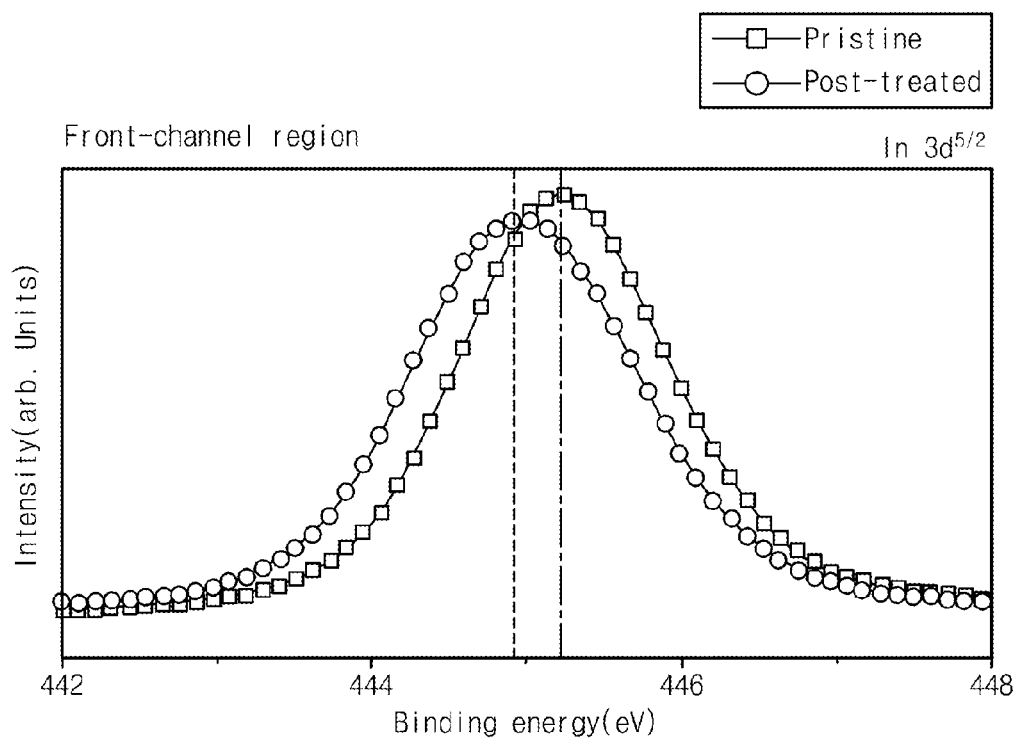
FIG. 28 is a graph showing In $3d^{5/2}$ spectra obtained through XPS with respect to the bottom side of an InZnO thin film according to a comparative embodiment and an InZnO thin film according to an embodiment.
Figure 29:
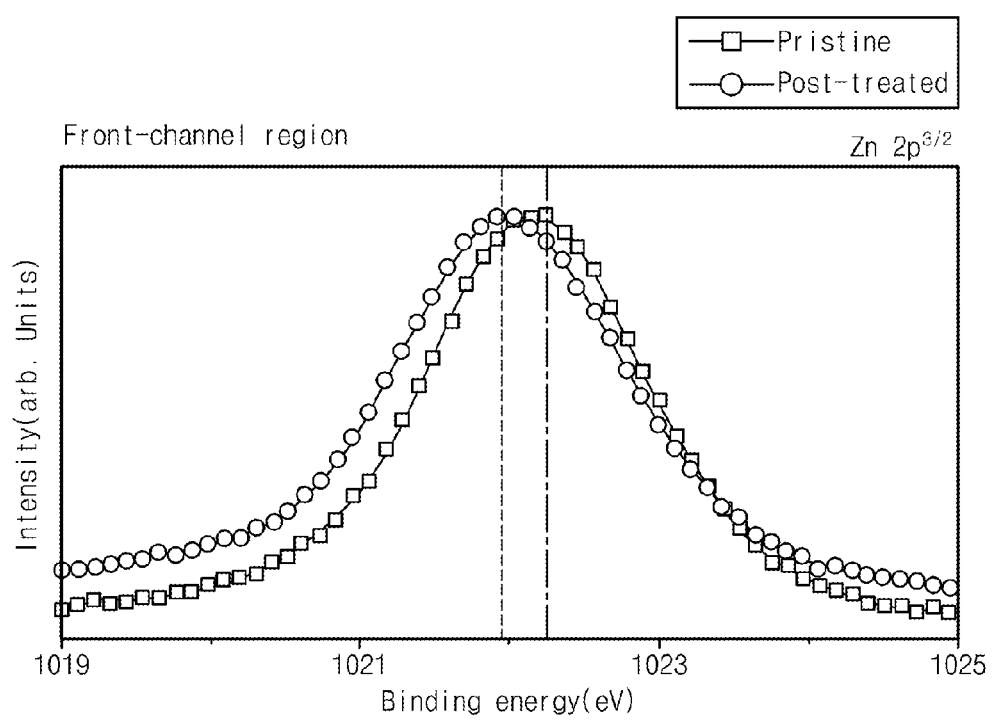
FIG. 29 is a graph showing Zn $2p^{3/2}$ spectra obtained through XPS with respect to the bottom side of an InZnO thin film according to a comparative embodiment and an InZnO thin film according to an embodiment.

FIG. 26 is a graph showing In $3d^{5/2}$ spectra obtained through XPS with respect to the top side of an InZnO thin film according to a comparative embodiment and an InZnO thin film according to an embodiment, FIG. 27 is a graph showing Zn $2p^{3/2}$ spectra obtained through XPS with respect to the top side of an InZnO thin film according to a comparative embodiment and an InZnO thin film according to an embodiment, FIG. 28 is a graph showing In $3d^{5/2}$ spectra obtained through XPS with respect to the bottom side of an InZnO thin film according to a comparative embodiment and an InZnO thin film according to an embodiment, and FIG. 29 is a graph showing Zn $2p^{3/2}$ spectra obtained through XPS with respect to the bottom side of an InZnO thin film according to a comparative embodiment and an InZnO thin film according to an embodiment.

Referring to FIGS. 26 and 27, both In $3d^{5/2}$ spectrum and Zn $2p^{3/2}$ spectrum at the top side of the thin film according to the example moved toward a direction increasing the binding energy when compared to the spectra of the comparative example.

Referring to FIGS. 28 and 29, both In $3d^{5/2}$ spectrum and Zn $2p^{3/2}$ spectrum at the bottom side of the thin film according to the example moved toward a direction decreasing the binding energy when compared to the spectra of the comparative example.

From this, it may be found that the bonds between the metal and the oxygen are relatively large at the top side and are relatively few at the bottom side in the thin film of the example.

A mechanism for obtaining an oxide thin film in which physical properties change in the thickness direction thereof by heat treating the oxide thin film in a first gas (for example, hydrogen) atmosphere and then heat treating in the atmosphere of a second gas (for example, oxygen) having higher diffusion activation energy than the first gas as in the embodiments of the inventive concept is as follows.

First, in the case that the oxide thin film is heat treated using the first gas, the first gas may diffuse into the oxide thin film and may break the bonds between the metal and the oxygen forming a metal oxide. As a result, the number of the bonds between the metal and the oxygen may decrease, the amount of the oxygen vacancies may increase, and the conductivity of the thin film may increase throughout the thin film. In addition, in the case that hydrogen is used as the first gas, oxygen making a bond with the metal may make a bond with the hydrogen to increase the amount of the hydroxyl groups in the thin film.

Then, in the case that the oxide thin film is heat treated with the second gas, the second gas having higher diffusion activation energy than the first gas may diffuse into the oxide thin film more slowly than the first gas and may make bonds with the metal broken from the oxygen. Thus, the amount of the bonds between the metal and the oxygen may become large at the top side of the thin film making contact with the gas when compared to the bottom side thereof. On the contrary, the oxygen vacancies and the hydroxyl groups may become small at the top side of the thin film. As a result, conductivity at the bottom side of the oxide thin film becomes relatively higher than the top side, and insulation property at the top side of the oxide thin film becomes relatively higher than the bottom side.

As described above, physical properties may become different at the top side and the bottom side of the oxide thin film according to the embodiment of the inventive concept, and a thin film with a single layer including the same metal oxide may have improved electrical properties as a thin film with a multilayer structure. Further, since the oxide thin film according to an embodiment of the inventive concept does not include interlayer interface different from a stack type thin film having a multilayer structure, the deterioration of electrical performance generated by the trapping of charges at the interface while the charges move via the thin film may not be generated.

When using the oxide thin film according to the embodiment of the inventive concept in various electronic apparatuses, the performance of the apparatus may be increased or the manufacturing costs thereof may be decreased.

The electronic apparatus may include a substrate 201 and an oxide thin film 202 formed on the substrate 201, and physical properties may change in the oxide thin film 202 in a thickness direction thereof as described in the embodiment of the inventive concept.

Here, the oxide thin film 202 may be formed on the top side of the substrate 201 as shown in FIGS. 3 and 4 to make direct contact with the substrate 201, and also may be formed on other elements (for example, a thin film) formed on the substrate 201 so that other element may be disposed between the substrate 201 ad the oxide thin film 202.

According to an embodiment, the electronic apparatus may include a transistor, and the oxide thin film according to the embodiment of the inventive concept may be provided as a channel layer of the transistor.

Figure 30:
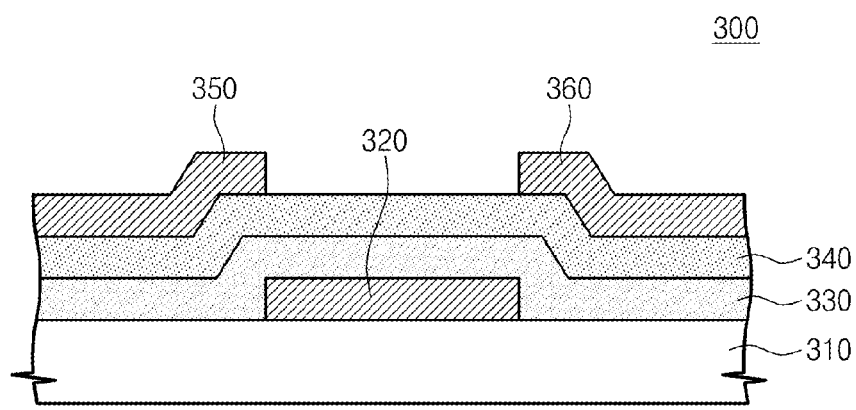
FIG. 30 is an exemplary cross-sectional view of a transistor including an oxide thin film according to an embodiment.

FIG. 30 is an exemplary cross-sectional view of a transistor 300 including an oxide thin film according to an embodiment.

As shown in FIG. 30, the transistor 300 may be a thin film transistor including a plurality of thin films. For example, the transistor 300 may include a substrate 310, a gate electrode 320, a gate insulating layer 330, a channel layer 340, a source electrode 350 and a drain electrode 360.

The oxide thin film according to an embodiment of the inventive concept may be provided as the channel layer 340 of the transistor 300. In this case, the transistor 300 may have improved electrical properties and reliability when compared to a transistor having an oxide thin film which is not post-treated as the channel layer, as explained referring to FIGS. 9 to 13.

For reference, the transistor 300 shown in FIG. 30 is a thin film transistor having a bottom gate structure, however the transistor capable of using the oxide thin film according to the embodiment of the inventive concept is not limited to the bottom gate structure.

According to another embodiment, the oxide thin film according to an embodiment of the inventive concept may be used in a memory. For example, in the case that the electronic apparatus includes a resistive memory, the oxide thin film according to an embodiment of the inventive concept may be provided as the insulation layer of the resistive memory.

Figure 31:
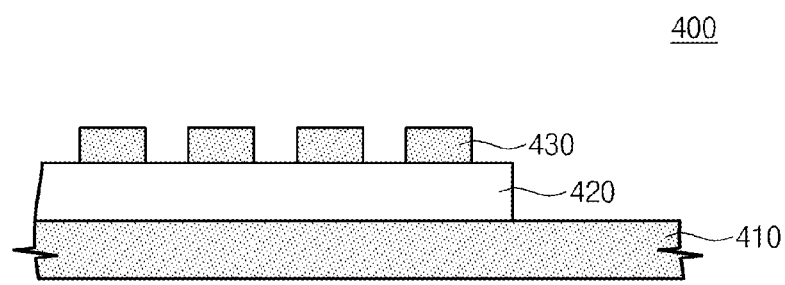
FIG. 31 is an exemplary cross-sectional view of a resistive memory including an oxide thin film according to an embodiment.

FIG. 31 is an exemplary cross-sectional view of a resistive memory 400 including an oxide thin film according to an embodiment.

As shown in FIG. 31, the resistive memory 400 may include a lower electrode 410, an insulation layer 420 and an upper electrode 430. In the resistive memory 400, the insulation layer 420 may be positioned between two electrodes 410 and 430, the resistance of the insulation layer 420 may change according to applied electrical signals via the electrodes, and data may be recorded.

The oxide thin film according to an embodiment of the inventive concept may be provided as the insulation layer 420 of the resistive memory 400. In this case, the resistive memory 400 may have improved electrical properties such as the ratio of high resistance state (HRS)/low resistance state (LRS) and reliability when compared to a resistive memory including an oxide thin film which is not post-treated as an insulation layer.

According to another embodiment, the oxide thin film according to an embodiment of the inventive concept may be used as an electrode in an electronic apparatus.

For example, the electronic apparatus may include an electronic device, and the oxide thin film according to an embodiment of the inventive concept may be provided to the terminal of the electronic device as an electrode.

The electronic device may include an optional device receiving and outputting electrical signals via the terminal. For example, the electronic device may include a diode, a transistor, an LED, an OLED, a sensor, etc., without limitation. According to an embodiment, the oxide thin film according to an embodiment of the inventive concept may be used as the transparent electrode of a touch screen.

If the oxide thin film according to an embodiment of the inventive concept is used as an electrode in the transistor 300 shown in FIG. 30, the oxide thin film may be provided as the source electrode 350 and the drain electrode 360 of the transistor 300.

In the case that the oxide thin film according to an embodiment of the inventive concept is used as an electrode in an electronic apparatus, an ohmic layer may not be provided at the contacting portion of the electrode and a device. That is, in the case that an electronic apparatus includes the oxide thin film according to an embodiment of the inventive concept, an additional ohmic layer may not be necessary between the electrode and the device.

As described above, the physical properties of the oxide thin film according to an embodiment of the inventive concept are different in the thickness direction thereof, and the conductivity at the top side is higher than the bottom side of the thin film. Thus, the bottom region of the oxide thin film may function as an ohmic layer between the top region and the device even though a separate ohmic layer is not formed at the contacting portion with the device and may be replaced for a common ohmic layer.

As a result, in the case that an oxide thin film according to an embodiment of the inventive concept is introduced as an electrode in an electronic apparatus, a process for forming a separate ohmic layer during manufacturing the electronic apparatus may be excluded, and manufacturing time and costs may be decreased.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An oxide thin film with a single layer comprising a metal oxide,
    wherein the oxide thin film presents an increasing or a decreasing trend in at least one of amount of oxygen vacancies, bonds between metal and oxygen, and hydroxyl groups in a thickness direction
    wherein the amount of oxygen vacancies increases from a back channel region which is far from a gate insulator to a front channel region which is close to the gate insulator in the thickness direction of the oxide thin film,
    wherein the amount of bonds between metal and oxygen decreases from the back channel region to the front channel region in the thickness direction of the oxide thin film, and
    wherein the amount of hydroxyl groups increases from the back channel region to the front channel region in the thickness direction of the oxide thin film.

2. The oxide thin film of claim 1, wherein the at least one of amount of oxygen vacancies, bonds between metal and oxygen, and hydroxyl groups increases or decreases gradually from the back channel region to the back channel region of the oxide thin film.

3. A transistor, comprising:
    a substrate; and
    a gate, a gate insulator, a channel layer, a source and a drain on the substrate,
    wherein the channel layer is an oxide thin film with a single layer comprising a metal oxide, and presents an increasing or a decreasing trend in at least one of amount of oxygen vacancies, bonds between metal and oxygen, and hydroxyl groups in a thickness direction,
    wherein the amount of oxygen vacancies increases from a back channel region which is far from the gate insulator to a front channel region which is close to the gate insulator in the thickness direction of the oxide thin film,
    wherein the amount of bonds between metal and oxygen decreases from the back channel region to the front channel region in the thickness direction of the oxide thin film, and
    wherein the amount of hydroxyl groups increases from the back channel region to the front channel region in the thickness direction of the oxide thin film.

* * * * *